United States Patent [19]
Yodoshi et al.

[11] Patent Number: 5,416,790
[45] Date of Patent: May 16, 1995

[54] SEMICONDUCTOR LASER WITH A SELF-SUSTAINED PULSATION

[75] Inventors: Keiichi Yodoshi; Akira Ibaraki; Masayuki Shono; Shoji Honda; Takatoshi Ikegami; Nobuhiko Hayashi; Koutarou Furusawa; Atushi Tajiri; Toru Ishikawa; Kenichi Matsukawa; Teruaki Miyake; Takenori Goto; Mitsuaki Matsumoto; Daisuke Ide; Yasuyuki Bessho, all of Moriguchi, Japan

[73] Assignee: Sanyo Electric Co., Ltd., Moriguchi, Japan

[21] Appl. No.: 147,779

[22] Filed: Nov. 4, 1993

[30] Foreign Application Priority Data

| Nov. 6, 1992 [JP] | Japan | 4-297178 |
| Feb. 26, 1993 [JP] | Japan | 5-038561 |
| Mar. 2, 1993 [JP] | Japan | 5-041492 |
| Jun. 30, 1993 [JP] | Japan | 5-161925 |

[51] Int. Cl.[6] .................................................. H01S 3/19
[52] U.S. Cl. ................................................ 372/46; 372/45
[58] Field of Search ......................................... 372/45, 46

[56] References Cited

U.S. PATENT DOCUMENTS

| 4,961,197 | 10/1990 | Tanaka et al. | 372/45 |
| 5,297,158 | 3/1994 | Naitou et al. | 372/46 |

FOREIGN PATENT DOCUMENTS

| 61-84891 | 4/1986 | Japan . |
| 63-202083 | 8/1988 | Japan . |

OTHER PUBLICATIONS

"A New Self-Aligned Structure For (GaAl) As High Power Lasers With Selectively Grown Light Absorbing GaAs Layers Fabricated by MOCVD" (Japanese Journal of Applied Physics, vol. 25, No. 6, Jun. 1986, pp. L498–L500).

*Primary Examiner*—James W. Davie
*Attorney, Agent, or Firm*—Darby & Darby

[57] ABSTRACT

A semiconductor laser with a self-sustained pulsation is disclosed in which a first cladding layer of first conductive type, an active layer and a second cladding layer of second conductive type having a striped ridge are formed in that order on a semiconductor substrate of first conductive type. The first and second cladding layers have a refractive index smaller than and a band gap larger than the active layer. A saturable optical absorbing layer having a band gap of energy substantially equal to the energy corresponding to lasing wavelength is formed in both the first and second cladding layers. Further, a barrier layer having a refractive index smaller than and a band gap larger than the first and second cladding layers is formed between the first cladding layer and the active layer and/or between the active layer and the second cladding layer.

10 Claims, 24 Drawing Sheets

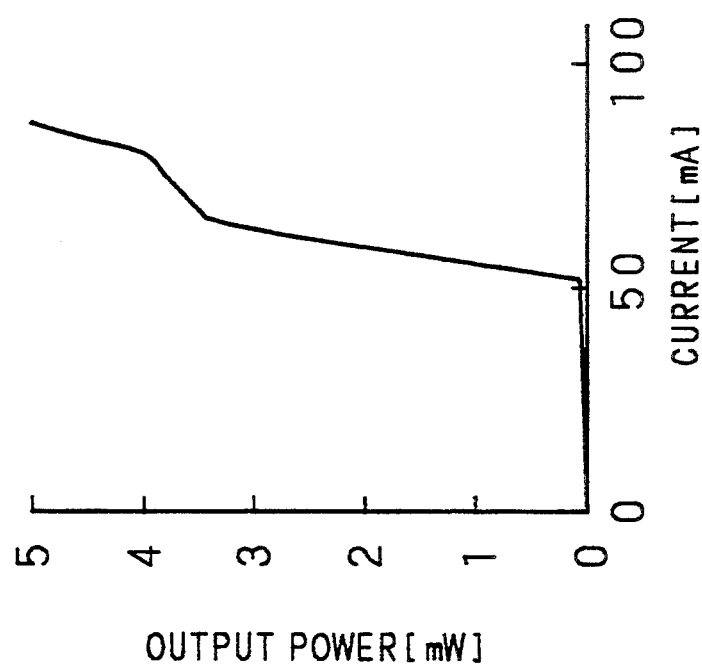
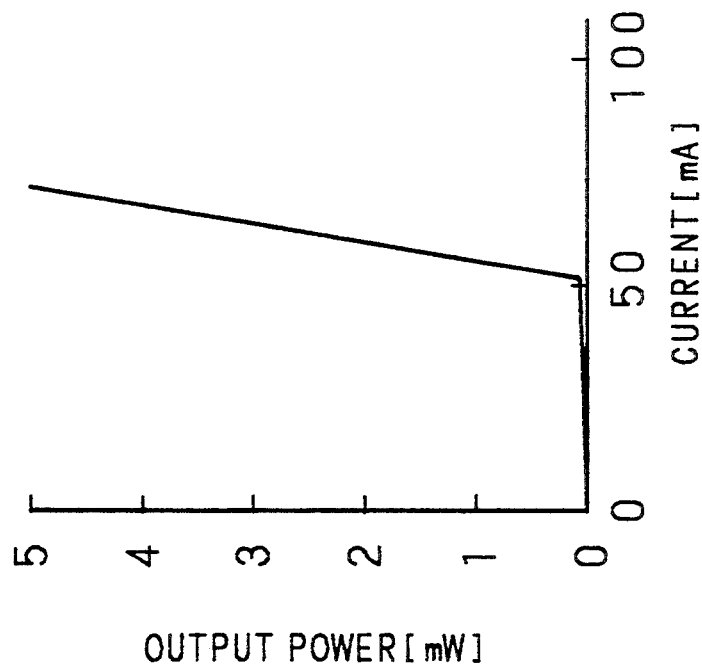
Fig. 21(a)
Fig. 21(b)

SEMICONDUCTOR LASER WITH A SELF-SUSTAINED PULSATION

BACKGROUND OF THE INVENTION

1. Field of the Invention

The present invention relates to a semiconductor laser with a self-sustained pulsation in which the noises attributable to the optical feedback of a laser beam are reduced.

2. Description of Related Art

The problem of conventional semiconductor lasers is that in the case where the optical feedback of a laser beam is applied repeatedly, a noise attributable to the optical feedback (called the optical feedback induced noise) is generated in the laser beam. The optical feedback induced noise is generated in such a manner that the optical feedback of the laser beam due to the reflection from the disk surface or the like reenters the semiconductor laser when it is used, for example, as a light source of an optical disk system.

An approach to a reduced optical feedback induced noise of the semiconductor laser by utilizing the self-sustained pulsation is disclosed by Japanese Patent Application Laid-Open No.63-202083(1988), for example. In this semiconductor laser, one of cladding layers sandwiching an active layer is constructed of a refractive index layer having a band gap energy considerably larger than the energy corresponding to the lasing wavelength (energy corresponding to lasing wavelength: hv, where h is Planck's constant and v frequency) or an optical absorbing layer having a band gap energy considerably smaller than the energy corresponding to lasing wavelength to generate a self-sustained pulsation.

According to the above-mentioned conventional semiconductor laser, however, in the case where a refractive index layer is used with a band gap energy considerably larger than the energy corresponding to lasing wavelength, the astigmatic distance is increased, while the use of an optical absorbing layer with a band gap energy considerably smaller than the energy corresponding to lasing wavelength increases the operating current. With a large astigmatic distance, the laser beam is difficult to converge. In the case where the semiconductor laser is used as a light source for an optical disk system or the like, therefore, the S/N for crosstalks is deteriorated, and an increased operating current increases the power consumption.

Japanese Patent Application Laid-Open No.61-84891 (1986), on the other hand, discloses a semiconductor laser having a thin film layer (saturable optical absorbing layer) formed only in one of the cladding layers, which has substantially the same composition as the active layer and a saturable optical absorption characteristic against a laser beam. Such a saturable optical absorbing layer can be easily formed by crystal growth, thereby making it possible to manufacture a semiconductor laser with a high volume productivity.

Nevertheless, experiments conducted by the present inventors have revealed that in the case of the above-mentioned conventional semiconductor laser, it is difficult to reduce the astigmatic distance sufficiently only by the relation between the composition ratio of the saturable optical absorbing layer and that of the active layer described.

If a high-output semiconductor laser is to be realized, a desired structure includes a first cladding layer, an active layer and a second cladding layer having a ridge section. This structure makes it necessary to control the film thickness of the flat portion of the second cladding layer at high accuracy. Japanese Journal of Applied Physics Vol.25, No.6, June 1986, pp. L498–L500, for example, discloses a semiconductor laser including a compound semiconductor containing Al in which an etching stop layer having an Al composition ratio different from the second cladding layer and absorbing no pulsated laser beam is formed on the flat portion to control the thickness of the flat portion.

Also, Nikkei Electronics, Aug. 31, 1981, pp.76–79 presents a semiconductor laser in which a very thin barrier layer for enclosing the carriers strongly without substantially affecting the light is formed on both sides of the active layer, and light is enclosed not by the refractive index difference between the active layer and the barrier layer but by the index difference between the active layer and the cladding layers thereby to improve the output beam divergence perpendicular to the junction. The disadvantage of this semiconductor laser is that thickness variations of the thin barrier layer have a great effect on the laser characteristics. It is therefore necessary to control the film thickness at high accuracy in order to avoid a low production yield.

SUMMARY OF THE INVENTION

An object of the invention is to provide a semiconductor laser for generating a self-sustained pulsation with a small astigmatic distance and a small operating current.

Another object of the invention is to provide a semiconductor laser with a self-sustained pulsation having a superior operating current characteristic and a superior beam divergence characteristic perpendicular to the junction.

Still another object of the invention is to provide a semiconductor laser with a self-sustained pulsation in which band gap energy can be easily matched between a saturable optical absorbing layer and an active layer thereby making it difficult to produce a kink at low optical output power.

A semiconductor laser with a self-sustained pulsation according to the invention has a first cladding layer of first conduction type formed on a semiconductor substrate, an active layer formed on the first cladding layer and a second cladding layer of second conduction type having a ridge section on the active layer, wherein the first and second cladding layers have a small refractive index and a large band gap as compared with the active layer, and a saturable optical absorbing layer is formed with a band gap of an energy substantially equal to the energy corresponding to lasing wavelength in both the first and second cladding layers. The fact that a saturable optical absorbing layer having a band gap energy substantially equal to the energy corresponding to lasing wavelength is formed in the first and second cladding layers sandwiching the active layer causes a self-sustained pulsation with a low astigmatic distance and a low operating current in unit transverse mode. Also, the saturable optical absorbing layer in the second cladding layer functions as an etching stop layer in forming the ridge section of the second cladding layer, so that the thickness of the flat portion of the second cladding layer can be controlled easily with high accuracy.

Further, the above-mentioned semiconductor laser has a barrier layer formed with a small refractive index and a large band gap as compared with the first and second cladding layers between the active layer and the first cladding layer and/or between the active layer and the second cladding layer. The beam divergence characteristic perpendicular to the junction and the operating current characteristic are thus improved.

Furthermore, the semiconductor laser has a saturable optical absorbing layer consisting of quantum well layers or a saturable optical absorbing layer consisting of strained quantum well layers. In this way, the band gap energy can be easily matched between the saturable optical absorbing layer and the active layer.

In addition, the semiconductor laser according to the invention has an active layer consisting of quantum well structure or strained quantum well structure. This enables the self-sustained pulsation frequency to be controlled, thereby producing a semiconductor laser of low noise.

The above and further objects and features of the invention will more fully be apparent from the following detailed description with accompanying drawings.

BRIEF DESCRIPTION OF THE DRAWINGS

FIG. 21(a) and 21(b) are graphs showing the optical power-current characteristic for the third embodiment and an example for comparison.

DESCRIPTION OF THE PREFERRED EMBODIMENTS

The invention will be described below with reference to the accompanying drawings showing embodiments.

First embodiment

Figure 1:
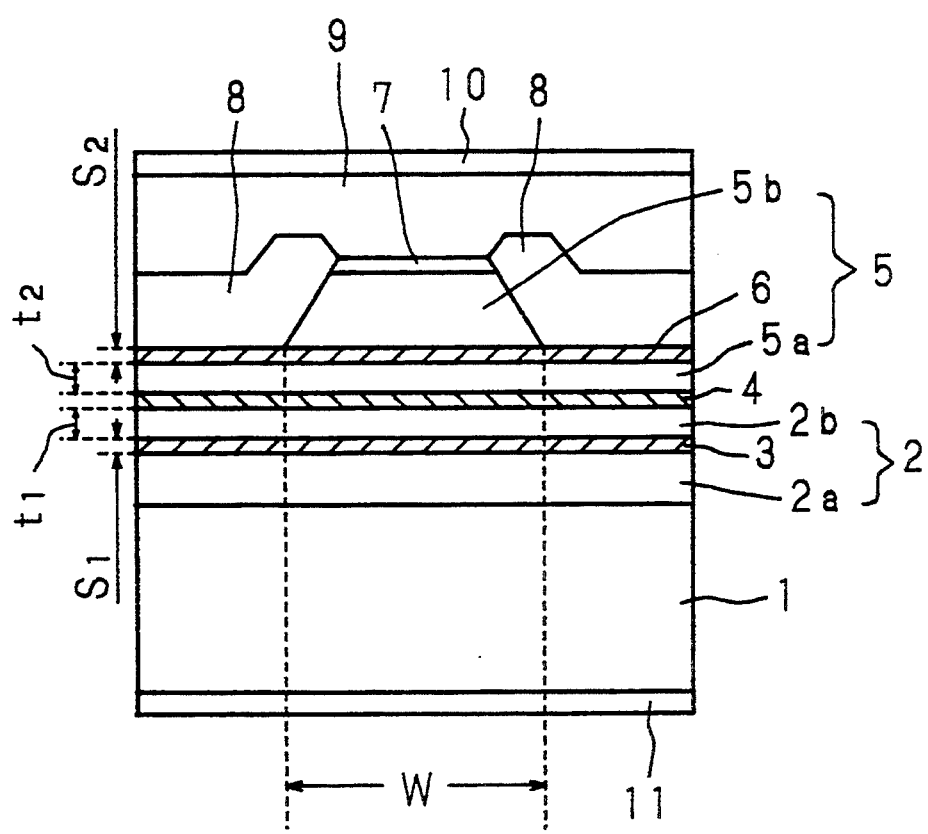
FIG. 1 is a sectional view showing a semiconductor laser according to a first embodiment of the invention.

A schematic diagram of a sectional structure of a AlGaAs semiconductor laser according to a first embodiment of the invention is shown in FIG. 1. In FIG. 1, reference numeral 1 designates an n-type GaAs semiconductor substrate, which has formed thereon an n-type $Al_{xa}Ga_{1-xa}As$ cladding layer (typically having 1 to 2 $\mu$m in thickness and 0.51 in composition ratio xa) 2a, an n-type $Al_uGa_{1-u}As$ first saturable optical absorbing layer having a thickness of $S_1$ (typically having a composition ratio of $0.12 \leq u \leq 0.14$ and a carrier concentration of $2 \times 10^{17}$ to $5 \times 10^{17}$ cm$^{-3}$) 3, and an n-type $Al_{xb}Ga_{1-xb}As$ cladding layer (typically having a thickness of $t_1=0.3$ $\mu$m and a composition ratio xb=0.51) 2b in that order. The two cladding layers 2a, 2b make up an n-type first cladding layer which has formed therein the first saturable optical absorbing layer 3.

The first cladding layer 2 (cladding layer 2b) has formed thereon an undoped $Al_qGa_{1-q}As$ active layer (typically having a film thickness of 0.08 $\mu$m and a composition ratio q of 0.13) 4. The active layer 4, in turn, has formed thereon a p-type $Al_{ya}Ga_{1-ya}As$ cladding layer (typically having a film thickness of $t_2$ of 0.3 $\mu$m and a composition ratio ya of 0.51) 5a and a p-type $Al_uGa_{1-u}As$ second saturable optical absorbing layer (typically having a composition ratio of $0.12 \leq u \leq 0.14$ and a carrier concentration of $4 \times 10^{17}$ to $2 \times 10^{18}$ cm$^{-3}$) 6 in that order. The second saturable optical absorbing layer 6 has formed on the central portion thereof a p-type $Al_{yb}Ga_{1-yb}As$ cladding layer (typically having a height of 0.5 to 1 $\mu$m, a width W of 4 $\mu$m of the lower side of the striper and a composition ratio yb of 0.51) 5b, which is a striped ridge section extending in the cavity direction. The two cladding layers 5a, 5b constitute a p-type second cladding layer 5 having a striped ridge section. The second cladding layer 5 includes the second saturable optical absorbing layer 6.

A p-type GaAs cap layer (typically having a thickness of 0.3 μm) 7 is formed on the upper surface of the ridge of the cladding layer 5b. Two n-type GaAs current-blocking layers (typically having a film thickness of 0.8 μm) 8, 8 are formed on the side of the cap layer 7, the side of the cladding layer 5b, and the upper surface of the second saturable optical absorbing layer 6 where no cladding layer 5b is formed. The current-blocking layers 8, 8 have the functions of narrowing current and absorbing light. The cap layer 7 and the current-blocking layers 8, 8 have a p-type GaAs contact layer (typically having a film thickness of 4 μm) 9 formed thereon. The contact layer 9 has formed thereon a p-type ohmic electrode 10 made of Au-Cr, and the semiconductor substrate 1 has an n-type ohmic electrode 11 made of Au-Sn-Cr formed on the lower side thereof.

With this semiconductor laser according to the first embodiment, the γ value, the astigmatic distance and the operating current for optical power of 3 mW were checked by changing the Al composition ratio u (the same value) and the thickness (the same value for both, i.e., $S_1 = S_2$) between the first saturable optical absorbing layer 3 and the second saturable optical absorbing layer 6. In the case presented, a device with a cavity length of 250 μm is not coated at the edges.

The γ value represents the degree of self-sustained pulsation (interference between longitudinal modes). When γ is 1, the self-sustained pulsation does not occur, and the degree of self-sustained pulsation increases with the approach of γ to zero. Experiments conducted by the inventors show that when a semiconductor laser is mounted on an optical disk system, a satisfactory C/N is obtained for the γ value of 0.7 or less, and a very satisfactory value is obtained for 0.6 or less. Also, as to the astigmatic distance in an optical system used with an ordinary disk apparatus, a sufficient laser focusing is attained with a satisfactory C/N for a small value of 17 μm or less, and an especially satisfactory C/N is obtained when the astigmatic distance is 15 μm or less where the laser beam is satisfactorily focused.

Figure 2:
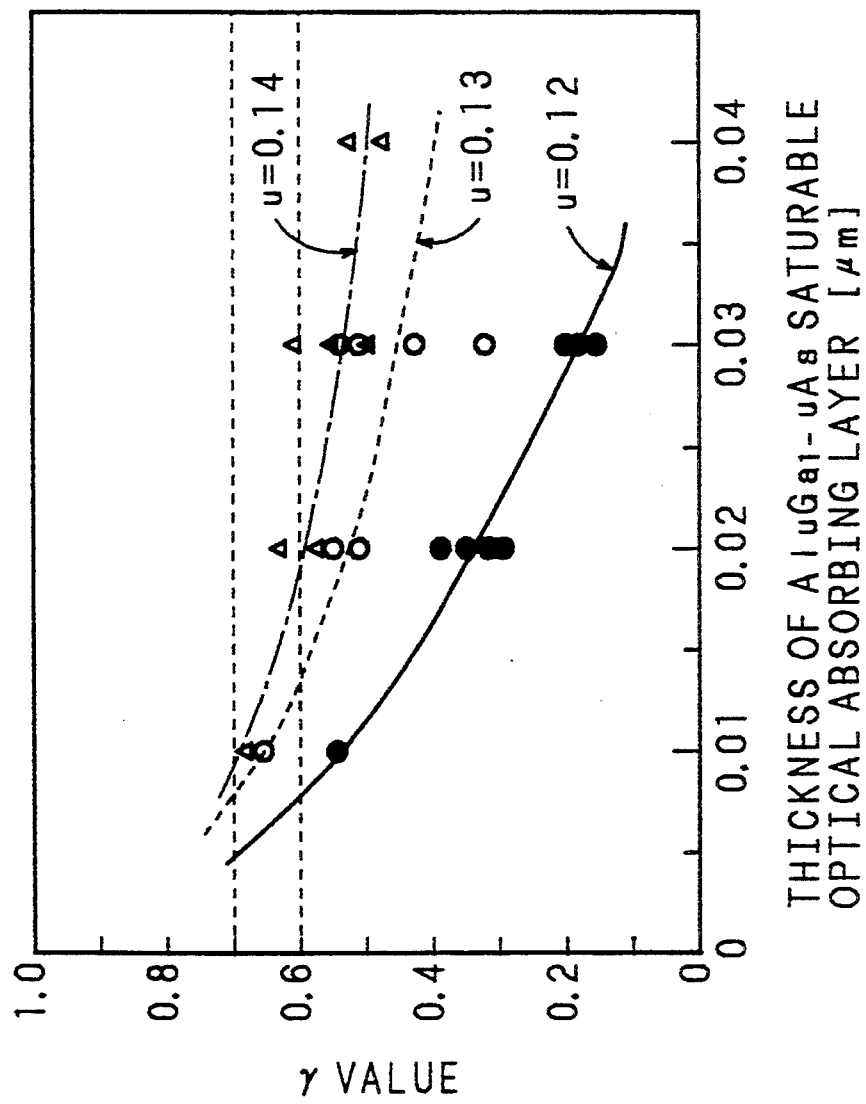
FIG. 2 is a graph showing the relation between the Al composition ratio and the $\gamma$ value (the value related to a visibility: If $\gamma=1$, an output light is coherent. If $\gamma=0$, an output light is incoherent) and between the layer thickness of the saturable optical absorbing layer and the $\gamma$ value according to a first embodiment.

First, refer to FIG. 2 showing the relation between the γ value and the thickness of the first and second saturable optical absorbing layers 3, 6 with the composition ratio u therebetween in the range of 0.12 to 0.14. It is seen from FIG. 2 that the γ value is 0.7 or less for the thickness of more than 0.01 μm of the first and second saturable optical absorbing layers 3, 6, and 0.6 or less for the thickness of more than 0.02 μm.

Figure 3:
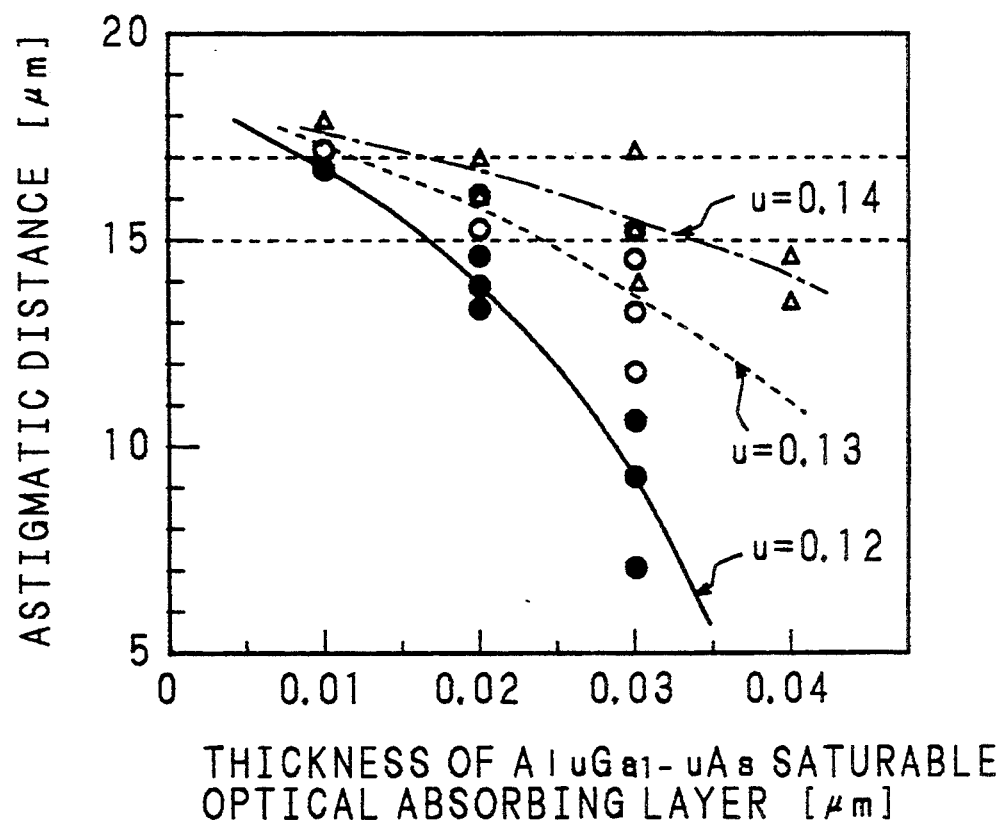
FIG. 3 is a graph showing the relation between the Al composition ratio and the thickness of the saturable optical absorbing layer and the astigmatic distance according to the first embodiment.

FIG. 3 shows the relation between the thickness of the first and second saturable optical absorbing layers 3, 6 and the astigmatic distance when the composition ratio u of the first and second saturable optical absorbing layers 3, 6 is in the range of 0.12 to 0.14. It will be seen from FIG. 3 that the astigmatic distance is less than 17 μm for the composition ratio of less than 0.13 of the first and second saturable optical absorbing layers 3, 6 having a thickness of 0.01 μm or more, and the astigmatic distance of less than 17 μm is obtained for the composition ratio u of 0.14 or less with the thickness of 0.02 μm or more.

Figure 4:
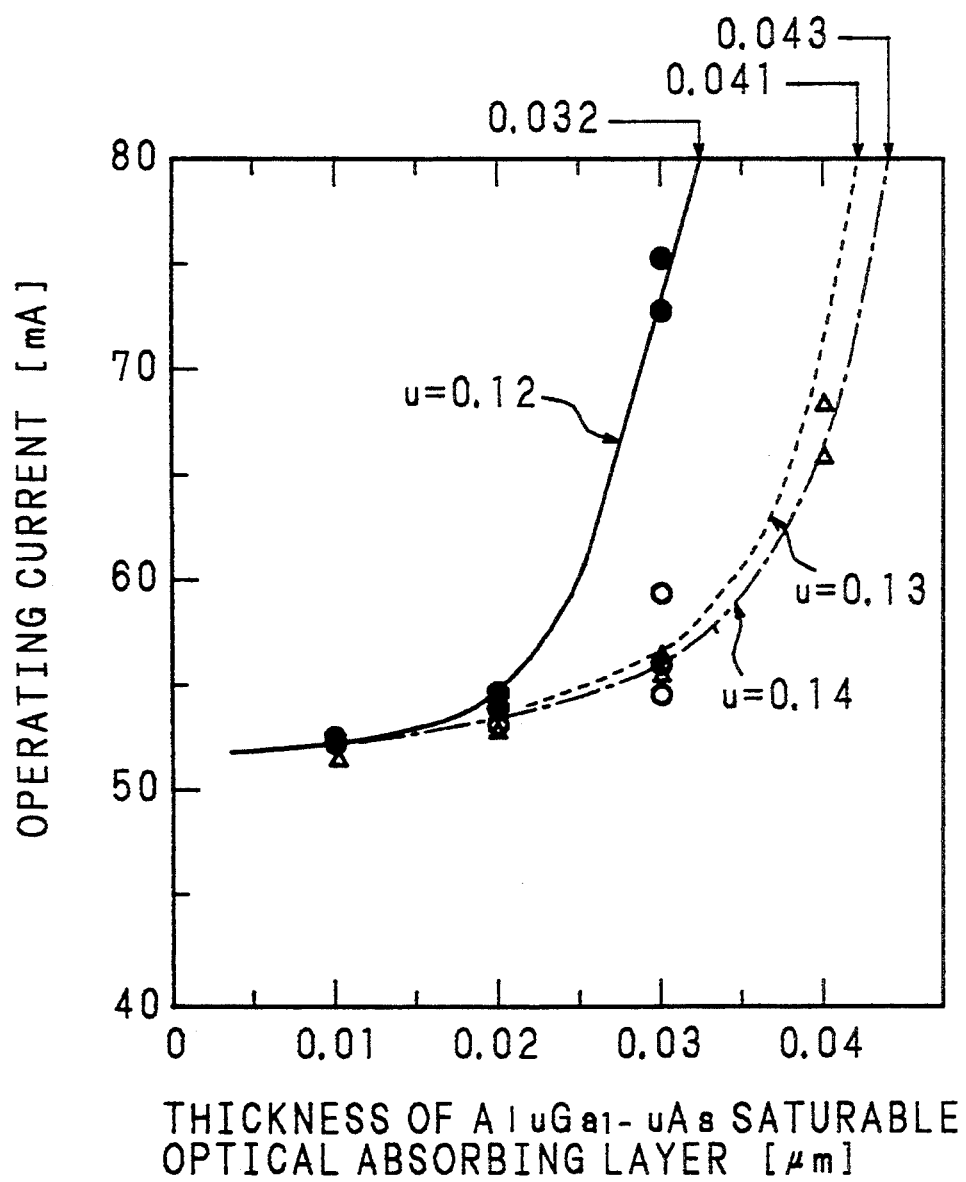
FIG. 4 is a graph showing the relation between the Al composition the layer thickness of the saturable optical absorbing layer and ratio and the thickness of the saturable optical absorbing layer and the operating current according to the first embodiment.

FIG. 4 shows the relation between the thickness of the first and second saturable optical absorbing layers 3, 6 and the operating current with optical power of 3 mW when the composition ratio μ of the first and second saturable optical absorbing layers 3, 6 is in the range of 0.12 to 0.14. The relation shown in FIG. 4 indicates that the operating current assumes a practically problem-free small value of less than 80 mA for the thickness of 0.032 μm or less of the first and second saturable optical absorbing layers 3, 6 when the composition ratio is 0.12 or more, for the thickness of 0.041 μm or less when the composition ratio is 0.13 or more, and for the thickness of 0.043 μm or less when the composition ratio is 0.14 or more.

As seen from FIGS. 2 to 4, it is possible to attain a satisfactory range of γ value, astigmatic distance and operating current as compared with the prior art in a fundamental transverse mode for the first and second saturable optical absorbing layers 3, 6 witch the difference of Al composition ratio with the active layer 4 in the range of −0.01 to 0.01 (i.e., $q - 0.01 \leq u \leq q + 0.01$; $0 \leq u < 0.2$). The reason for this satisfactory effect is that the difference in absolute value between the band gap energy of the first and second saturable optical absorbing layers 3, 6 and the band gap energy of the active layer 4, i.e., the energy corresponding to lasing wavelength is 0.0125 eV or less and therefore the two energies are substantially equal to each other, thereby producing a satisfactory saturable condition.

Figure 5:
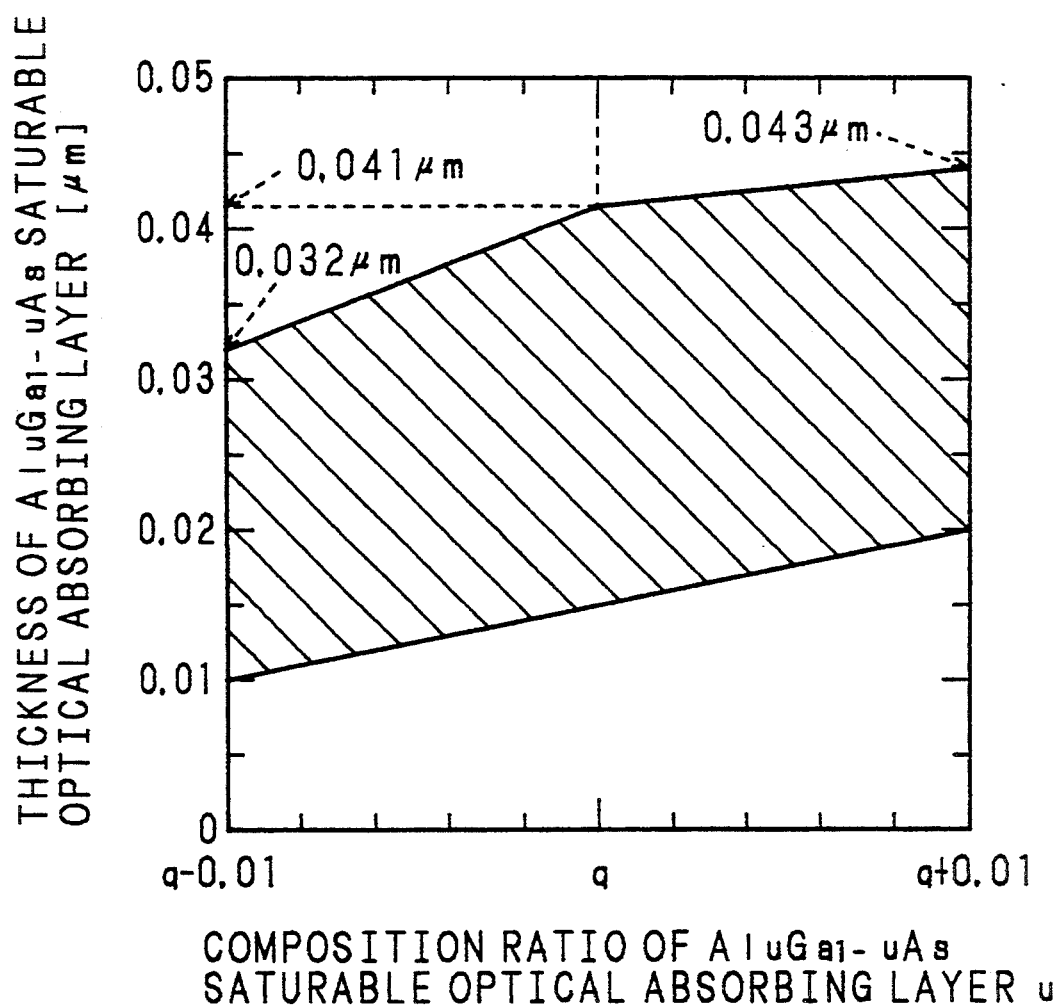
FIG. 5 is a diagram showing the range of Al composition ratio u and the thickness of a saturable optical absorbing layer having a superior characteristic according to the first embodiment.

More specifically, even when the Al composition ratio q of the active layer 4 is selected in the range of $0 \leq q < 0.2$ instead of limiting it to 0.13, satisfactory values of γ, astigmatic distance and operating current are obtained with fundamental transverse mode as far as the values $S_1$ and $S_2$ of the thickness and the Al composition ratio u ($0 \leq u < 0.2$) of the first and second saturable optical absorbing layers 3, 6 are selected from within the range defined by hatching in FIG. 5.

In the example described above, the thickness $t_1$ of the cladding layer 2b and the thickness $t_2$ of the cladding layer 5a are both 0.3 μm. The γ value, the astigmatic distance and the operating current for the optical power of 3 mW were investigated by changing the two layer thicknesses $t_1$ and $t_2$ to t. It is assumed that the composition ratio u of the first and second saturable optical absorbing layers 3, 6 is 0.13, the layer thickness is 0.03 μm, and the composition ratio q of the active layer 4 is 0.13.

Figure 6:
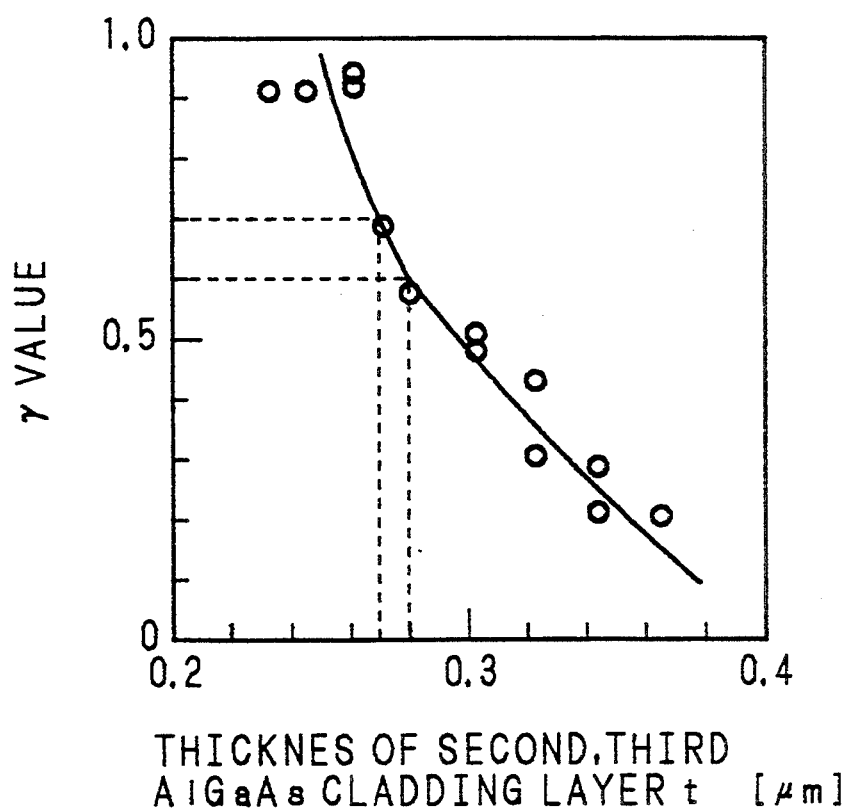
FIG. 6 is a graph showing the relation between the thickness of the cladding layer and the $\gamma$ value according to the first embodiment.

FIG. 6 shows the relation between the layer thickness t and the γ value. It is seen from FIG. 6 that the γ value is 0.7 or less for the layer thickness t of 0.27 μm or more, and 0.6 or less for the thickness of 0.28 μm or more.

Figure 7:
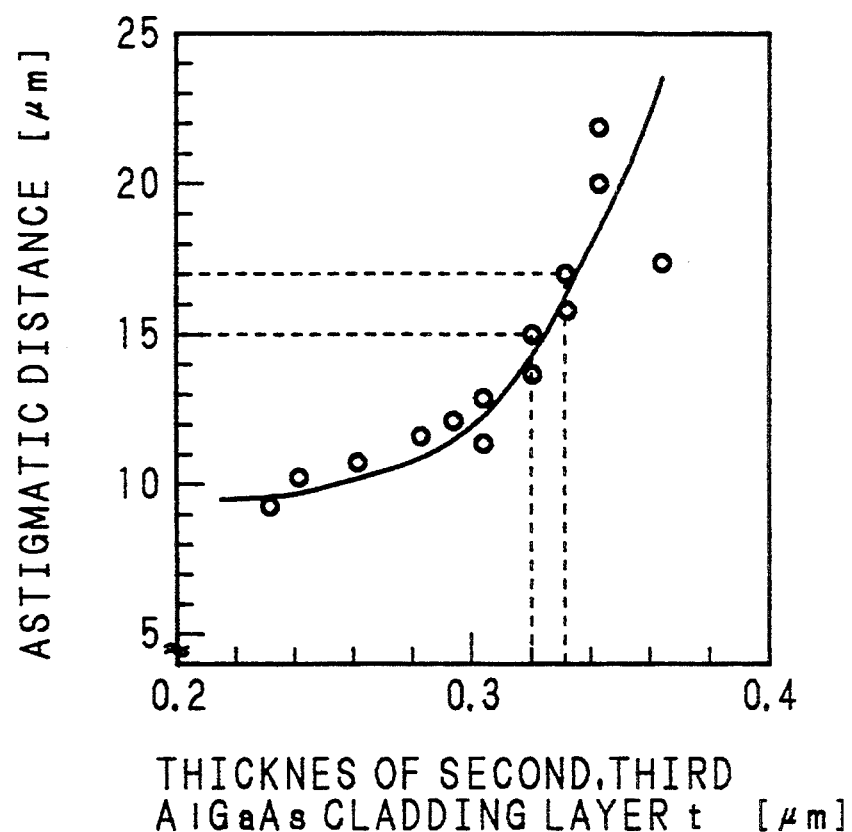
FIG. 7 is a graph showing the relation between the thickness of the cladding layer and the astigmatic distance according to the first embodiment.

The relation between the layer thickness t and the astigmatic distance is shown in FIG. 7. From FIG. 7, it is seen that the astigmatic distance is 17 μm or less for the layer thickness t of 0.33 μm or less, and 15 μm or less for the thickness of 0.32 μm or less.

Figure 8:
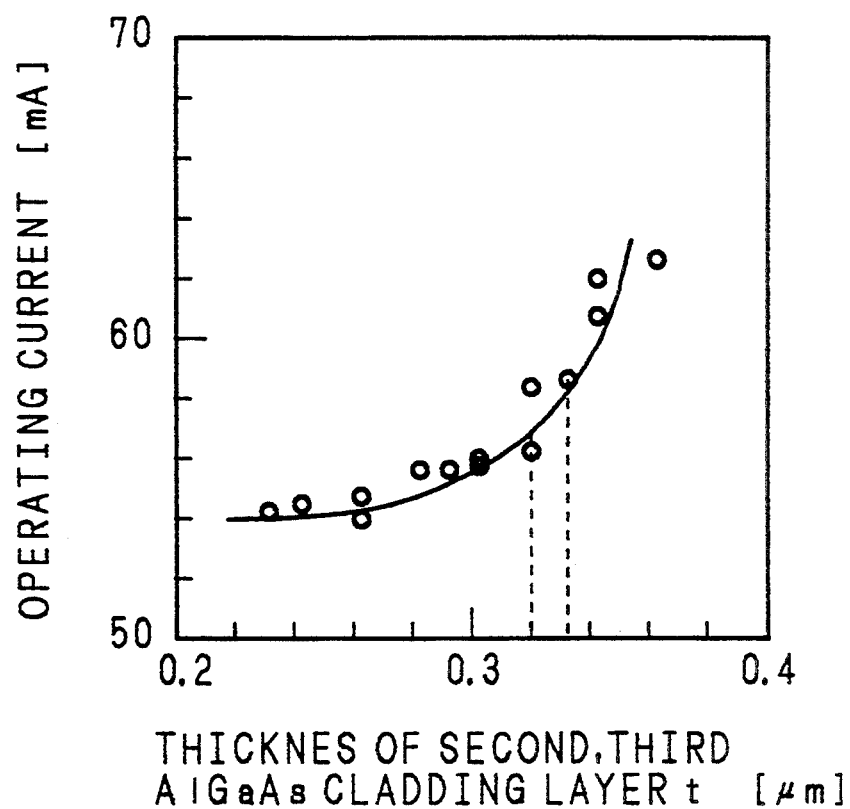
FIG. 8 is a graph showing the relation between the thickness of the cladding layer and the operating current according to the first embodiment.

FIG. 8 shows the relation between the layer thickness t and the operating current. It is seen from FIG. 8 that the operating current becomes a satisfactory value for the layer thickness t of 0.33 μm or less, and a very satisfactory value for the thickness of 0.32 μm or less.

As a result, the thickness t of the cladding layer 2b and the cladding layer 5a can be selected within the range of 0.27 μm to 0.33 μm, or preferably in the range of 0.28 μm to 0.32 μm. Although the cladding layers 2b and 5a have been assumed to have the same thickness t ($0.27 \mu m \leq t \leq 0.33 \mu m$), the same effect is obtained also when the thicknesses $t_1$, $t_2$ of the cladding layers 2b, 5a are differentiated within the range of 0.27 μm to 0.33

μm. An especially preferable effect is obtained when the thickness is selected in the range of 0.28 μm to 0.32 μm. Also when the composition ratio and the thickness of the first and second saturable optical absorbing layers 3, 6 and the active layer 4 are changed, a desirable effect is obtained by optimizing the thickness of the cladding layers 2b, 5a.

A method of fabricating a semiconductor laser according to the first embodiment will be explained below with reference to FIG. 9.

Figure 9A:
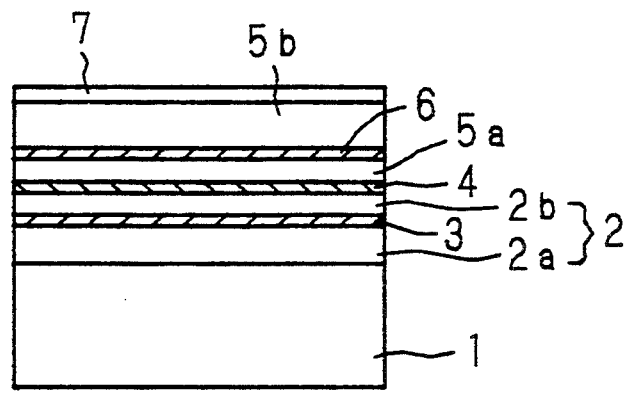
FIGS. 9(a), 9(b) and 9(c) are sectional views showing the fabrication process for a semiconductor laser according to the first embodiment.

First, as shown in FIG. 9(a), the metal organic chemical vapor deposition method (MOCVD method) or the molecular beam epitaxial method (MBE method) is used to grow an n-type cladding layer 2a, an n-type first saturable optical absorbing layer 3, an n-type cladding layer 2b, an undoped active layer 4, a p-type cladding layer 5a, a p-type second saturable optical absorbing layer 6, a p-type cladding layer 5b and a p-type cap layer 7 successively in that order on the n-type semiconductor substrate 1.

Figure 9B:
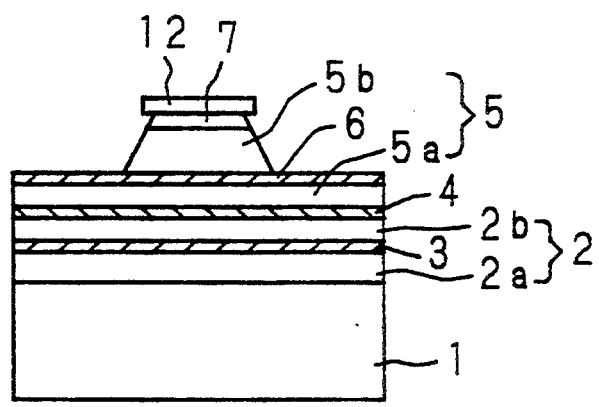

Next, as shown in FIG. 9(b), a striped SiO$_2$ mask layer 12 having a thickness of 0.2 μm is formed on the p-type cap layer 7 by the use of an ordinary photolithography technique. With the SiO$_2$ layer 12 as a mask, an etching solution consisting of the H$_3$PO$_4$—H$_2$O$_2$—H$_2$O system is used to etch the p-type cap layer 7 and the p-type cladding layer 5b in such a manner as to leave the p-type cladding layer 5b to a thickness of 0.1 to 0.3 μm. After that, this residual cladding layer 5b is etched off with a hydrochloric acid etchant to form a striped ridge section. In the case of the hydrochloric acid etchant, since the Al$_v$Ga$_{1-v}$As small in Al composition ratio has an etching rate smaller than the Al$_s$Ga$_{1-s}$As large therein (v<s), the second saturable optical absorbing layer 6 functions as what is called an etching stop layer at the same time. Thus the etching can be stopped with a high controllability by the second saturable optical absorbing layer 6.

Figure 9C:
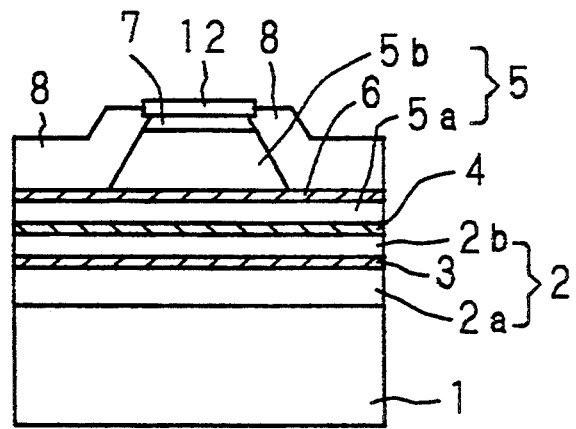

After that, as shown in FIG. 9(c), n-type current-blocking layers 8, 8 are formed on the second saturable optical absorbing layer 6 and on the side of the p-type cladding layer 5b and the cap layer 7 having a ridge section by the MOCVD or MBE method through the SiO$_2$ mask layer 12. Then the SiO$_2$ mask layer 12 is removed by the HF etchant to expose the p-type cap layer 7. A p-type contact layer 9 is then formed on the n-type current-blocking layers 8, 8 and the p-type cap layer thus exposed by the MOCVD or MBE method. An n-type ohmic electrode 11 made of Au-Sn-Cr and a p-type ohmic electrode 10 made of Au-Cr are formed on the lower surface of the n-type GaAs substrate 1 and on the upper surface of the p-type contact layer 9, thereby fabricating a semiconductor laser as shown in FIG. 1.

As described above, the second saturable optical absorbing layer 6, which has a band gap energy substantially equal to the energy corresponding to lasing wavelength (the Al$_v$Ga$_{1-v}$As has a larger band gap and a smaller refractive index with the increase in composition ratio v), is small in Al composition ratio (u<yb) and slow in etching rate as compared with the cladding layer 5b and doesn't execute excessive optical absorption, thereby making selection of sufficient layer thickness possible for etching. As a consequence, the second saturable optical absorbing layer 6 functions satisfactorily as an etching stop layer in the mesa etching process described above. The thickness of the cladding layer 5a providing a flat portion of the second cladding layer 5 on the active layer 4 can be controlled with high accuracy.

By the way in the case where a saturable optical absorbing layer having substantially the same composition as the active layer is formed only on one of the cladding layers as according to the prior-art semiconductor laser, it is necessary to increase the thickness of the flat portion (cladding layer 5a in FIG. 1) of the second cladding layer (5 in FIG. 1) having a ridge section, if self-sustained pulsation is to be maintained. The result is a larger astigmatic distance in the prior-art semiconductor laser. The astigmatic distance can be reduced by decreasing the thickness of the flat portion of the second cladding layer. When the flat portion is reduced in thickness, however, the saturable optical absorbing layer must be made thicker in order to maintain the self-sustained pulsation, undesirably resulting in a larger asymmetry of the laser beam spot.

In the semiconductor laser with a self-sustained pulsation having a saturable optical absorbing layer, which executes optical absorption, the internal loss becomes large and threshold gain increases, as a result, the operating current comes to be large. Accordingly, since it is thought that the provision of saturable optical absorbing layers in both cladding layers as the present embodiment causes the operating current to increase remarkably, the concerned makers don't have a motive to form the above configuration.

However, the following fact is made know by the present inventors. In the case where the saturable optical absorbing layers 3, 6 having a band gap energy substantially equal to the energy corresponding to lasing wavelength are formed respectively in the first and second cladding layers 2, 5, the layer thickness t$_2$ of the cladding layer 5a can be reduced, the resonant wave front in the direction perpendicular to the junction is curved in the same manner as the wave front in the direction parallel to the junction and the traveling speed of these wave fronts is considered to approach each other, the astigmatic distance and the beam divergence perpendicular to the junction become smaller than those of the prior-art semiconductor laser with a self-sustained pulsation. Accordingly, it is unnecessary to increase the thickness of the saturable optical absorbing layer. Furthermore, since the layer thickness t$_2$ of the cladding layer 5a becomes small as described above, on the flat portion (the cladding layer 5a) the lateral beam divergence of the current flowing from the ridge section (the cladding layer 5b) is reduced. As a result, a high current density is obtained with a small operating current, and the operating current can be reduced contrary to the concerned makers' expectations.

The present embodiment employs an unprecedented configuration in which the second saturable optical absorbing the layer thickness of the saturable optical absorbing layer and layer 6 is kept in contact with current-blocking layers 8, 8 at the portion except the ridge section. This configuration makes the second saturable optical absorbing layer 6 have the function as an etching stop layer. Accordingly, the layer thickness t$_2$ of the cladding layer 5a on the active layer 4 can be controlled with high accuracy without forming an etching stop layer separately.

Further, the second saturable optical absorbing layer 6 is arranged in proximity to the active layer 4, so it may function as a waveguide layer. In the case where the second saturable optical absorbing layer 6 is not in contact with the current-blocking layer 8, the transverse mode would be unstable. In spite of this, a stable transverse mode is attained according to the present embodiment since the second saturable optical absorbing layer 6 is in contact with the current-blocking layer 8 having such a composition as to cause light absorption. The reason why such a configuration is obtained is that the saturable optical absorbing layers 3, 6 are formed in both the first and second cladding layers 2, 5 and the thickness of the flat section is reduced.

According to the first embodiment having saturable optical absorbing layers 3, 6 with a band gap energy substantially equal to the energy corresponding to lasing wavelength in both the first and second cladding layers 2, 5, a satisfactory self-sustained pulsation is generated with a sufficiently small astigmatic distance and a fundamental transverse mode as compared with the prior art through a sufficiently small operating current as compared with the prior art. As a result, the optical feedback induced noise is reduced and a highly reliable semiconductor laser with a simple optical system structure is fabricated.

In addition, in the above configuration, it is to be desired that the distance from the active layer 4 to the first saturable optical absorbing layer 3 is equal to that from the active layer 4 to the second saturable optical absorbing layer 6 in order to make more symmetrical laser beam spot.

In this first embodiment, it is desirable to insert an n-type GaAs buffer layer between the semiconductor substrate 1 and the cladding layer 2a.

The reason why the saturable optical absorbing layer can execute saturable optical absorption even if the band gap of it is larger than that of the active layer is that it executes optical absorption between impurity levels by impurity generating the conductivity thereof.

Second embodiment

Even when a saturable optical absorbing layer having a band gap of energy substantially equal to the energy corresponding to the lasing wavelength is formed in both the two cladding layers sandwiching the active layer as according to the first embodiment, the beam divergence θ in perpendicular direction (lamination direction) of the laser beam output cannot sometimes be sufficiently reduced. In the case where the beam divergence θ in perpendicular direction is large, the coupling efficiency of an objective lens used in the optical disk system is reduced. It is therefore necessary to increase the laser output, thereby leading to the problem of a larger power consumption. One approach to reducing the perpendicular beam divergence θ is to reduce the difference of refractive index between the cladding layers and the active layer. When the refractive index is reduced, however, the band gap difference between the cladding layers and the active layer is also reduced, thereby giving rise to the problem of a larger operating current.

The second embodiment described below is intended to obviate the above-mentioned problems. According to the second embodiment, a barrier layer having a refractive index smaller than and a band gap larger than the first and second cladding layers is formed between the first cladding layer and the active layer and/or between the second cladding layer and the active layer. The second embodiment will be explained below.

Figure 10:
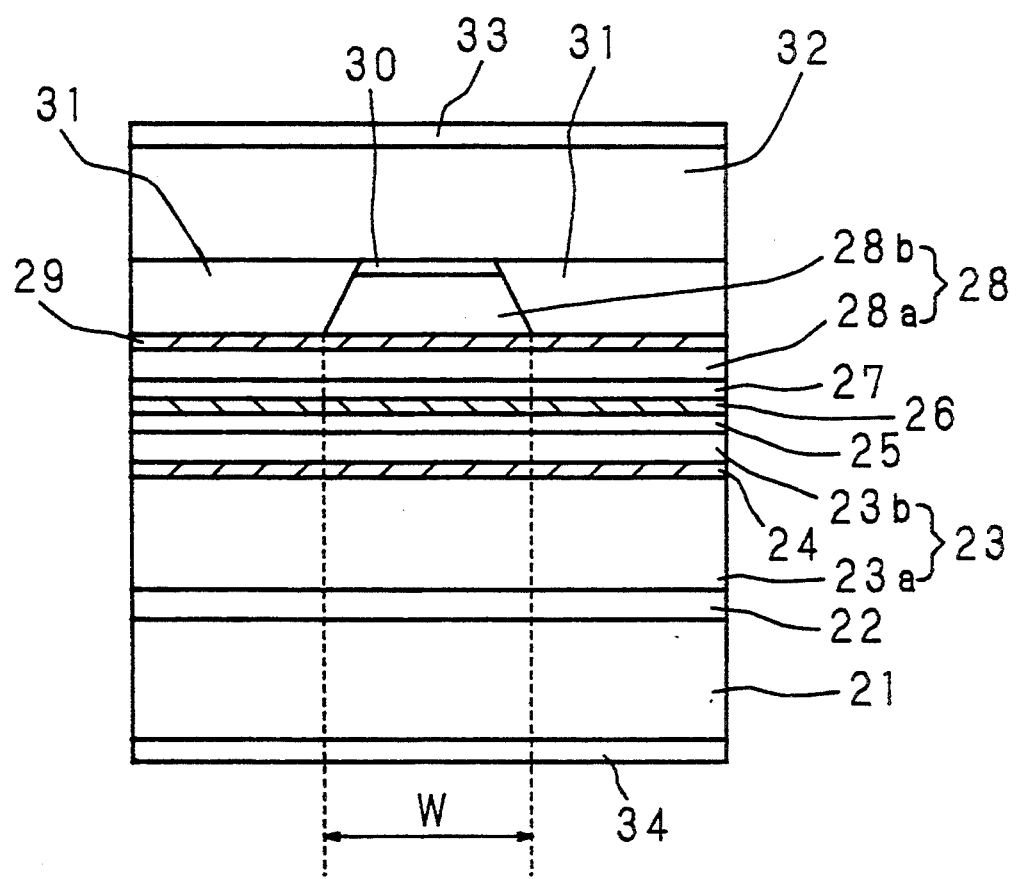
FIG. 10 is a sectional view showing a semiconductor laser according to a second embodiment of the invention.

FIG. 10 is a schematic diagram showing a sectional structure of an AlGaAs semiconductor laser according to the second embodiment of the invention. In FIG. 10, numeral 21 designates an n-type GaAs semiconductor substrate, which has formed thereon an n-type GaAs buffer layer (typically having a thickness of 0.5 μm) 22, an n-type $Al_{xa}Ga_{1-xa}As$ cladding layer (typically having a thickness of 1.5 μm and a composition ratio xa of 0.5) 23a, an n-type $Al_{ua}Ga_{1-ua}As$ first saturable optical absorbing layer (typically having a thickness of 0.03 μm and a composition ratio ua of 0.13) 24 and an n-type $Al_{xb}Ga_{1-xb}As$ cladding layer (typically having a thickness of 0.2 μm and a composition ratio xb of 0.5) 23b, in that order. The two cladding layers 23a, 23b make up an n-type first cladding layer 23, in which the first saturable optical absorbing layer 24 is formed.

The first cladding layer 23 (cladding layer 23b) has formed thereon an n-type $Al_{za}Ga_{1-za}As$ first barrier layer (typically having a thickness of 0.1 μm and a composition ratio za of 0.55) 25, an undoped $Al_qGa_{1-q}As$ active layer (typically having a thickness of 0.08 μm and a composition ratio q of 0.13) 26 and a p-type $Al_{zb}Ga_{1-zb}As$ second barrier layer (typically having a thickness of 0.1 μm and a composition ratio zb of 0.55) 27, in that order.

The second barrier layer 27, on the other hand, has formed thereon a p-type $Al_{ya}Ga_{1-ya}As$ cladding layer (typically having a thickness of 0.2 μm and a composition ratio ya of 0.5) 28a and a p-type $Al_{ub}Ga_{1-ub}As$ second saturable optical absorbing layer (typically having a thickness of 0.03 μm and a composition ratio ub of 0.13) 29, in that order. The second saturable optical absorbing layer 29, in turn, has the central portion thereof formed with a p-type $Al_{yb}Ga_{1-yb}As$ cladding layer (typically having a thickness of 0.7 μm, a width W of 3.5 μm of the lower side of the stripe and a composition ratio yb of 0.5) 28b formed as a striped ridge section extending in the cavity direction. The two cladding layers 28a, 28b constitute a p-type second cladding layer 28 having a striped ridge section. The second saturable optical absorbing layer 29 is formed in the second cladding layer 28.

The following relation holds between the Al composition ratio of each layer:

ua < xa, xb, ya, yb: ub < xa, xb, ya, yb:
za > xa, xb, ya, yb: zb > xa, xb, ya, yb:
q < xa, xb, ya, yb:

The cladding layer 28b has the upper surface of the ridge section thereof formed with a p-type GaAs cap layer (typically having a thickness of 0.3 μm) 30. Two n-type GaAs current-blocking layers (typically having a thickness of 0.8 μm) 31, 31 are formed on the side of the cap layer 30, on the side of the cladding layer 28b, and on the upper surface of the second saturable optical absorbing layer 29 where no cladding layer 28b is formed. The cap layer 30 and the current-blocking layers 31, 31 have formed thereon a p-type GaAs contact layer (typically having a thickness of 6 μm) 32. The contact layer 32, in turn, has formed thereon a p-type ohmic electrode 33 of Au-Cr, and the lower side of the semiconductor substrate 21 has formed thereon an n-type ohmic electrode 34 of Au-Sn-Cr.

Figure 11A:
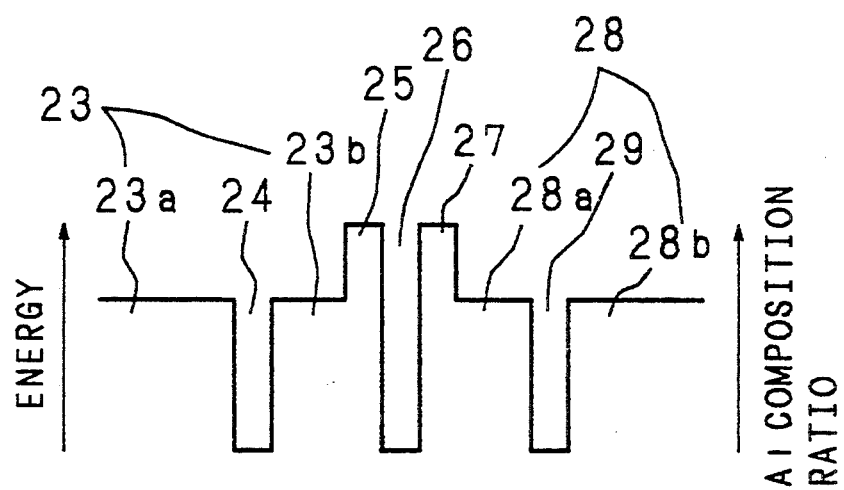
FIGS. 11(a) and 11(b) are diagrams showing an energy band structure and the refractive index in the neighborhood of an active layer according to the second embodiment.
Figure 11B:
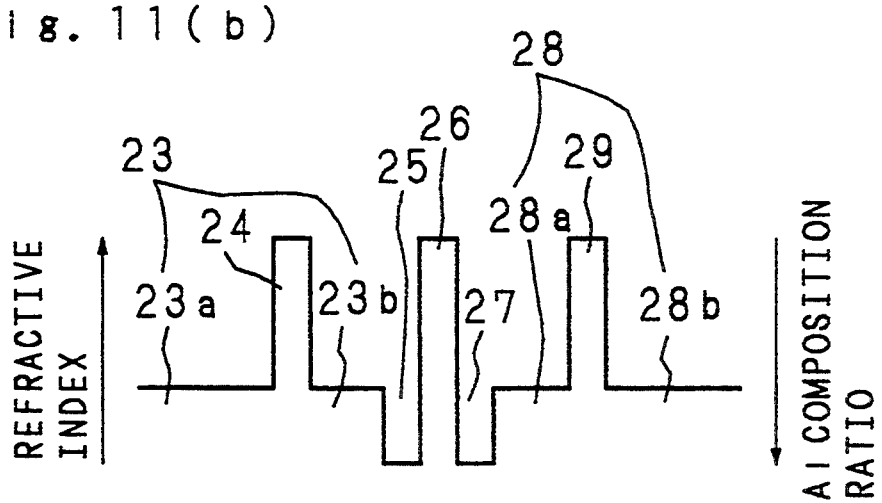

FIG. 11(a) is a schematic diagram showing the energy band structure in the neighborhood of the active layer 26 of a semiconductor laser according to the second embodiment, and FIG. 11(b) is a schematic diagram showing the refractive index in the neighborhood of the active layer 26. As seen from these diagrams, the first and second cladding layers 23, 28 have a refractive index smaller than and a band gap larger than the active layer 26. First and second barrier layers 25, 27 having a refractive index smaller than and a band gap larger than the first and second cladding layer 23, 28 and a thickness larger than the active layer 26 are formed in such a position as to sandwich the active layer 26 on both sides thereof. The resulting assembly is sandwiched by the first and second saturable optical absorbing layers 24, 29 having the same band gap (refractive index) as the active layer 26, i.e., having an energy band gap equal to the energy corresponding to raising wavelength, which layers 24, 29 are formed in the first and second cladding layer 23, 28.

The foregoing description involves only a configuration including the first and second barrier layers 25, 27 on both sides of the active layer 26. Instead, only the second barrier layer 27 may be formed without the first barrier layer 25. The beam divergence perpendicular to the junction $\theta$ (degree) of laser beam with output power of 3 mW at 25° C., the operating current $I_{op}$ (mA), the pulsation threshold current $I_{th}$ (mA) at temperature of 25° C. and the characteristic temperature $T_o$ (K) in the range of 25° C. to 70° C. were measured with regard to a semiconductor laser as case 1 of the second embodiment having the first and second barrier layers 25, 27 on both sides thereof, a semiconductor laser as case 2 of the second embodiment having the same configuration as case 1 except that the first barrier layer 25 is omitted, and a semiconductor laser as a reference case lacking both the first and second barrier layers 25, 27. The lasers according to the cases 1 and 2 and the reference case have the same distance between the first saturable optical absorbing layer 24 and the active layer 26 and between the second saturable optical absorbing layer 29 and the active layer 26, and other conditions are also shared by them, except for the presence or absence of the first and second barrier layers. Also, the measurement was conducted on two common values of $3 \times 10^{17}$ cm$^3$ and $6 \times 10^{17}$ cm$^3$ of the p-type carrier concentration between the second barrier layer 27 and the cladding layer 28a. The result is shown in FIGS. 12 to 15. In this measurement, each laser is subjected to a satisfactory self-sustained pulsation in unit transverse mode.

Figure 12:
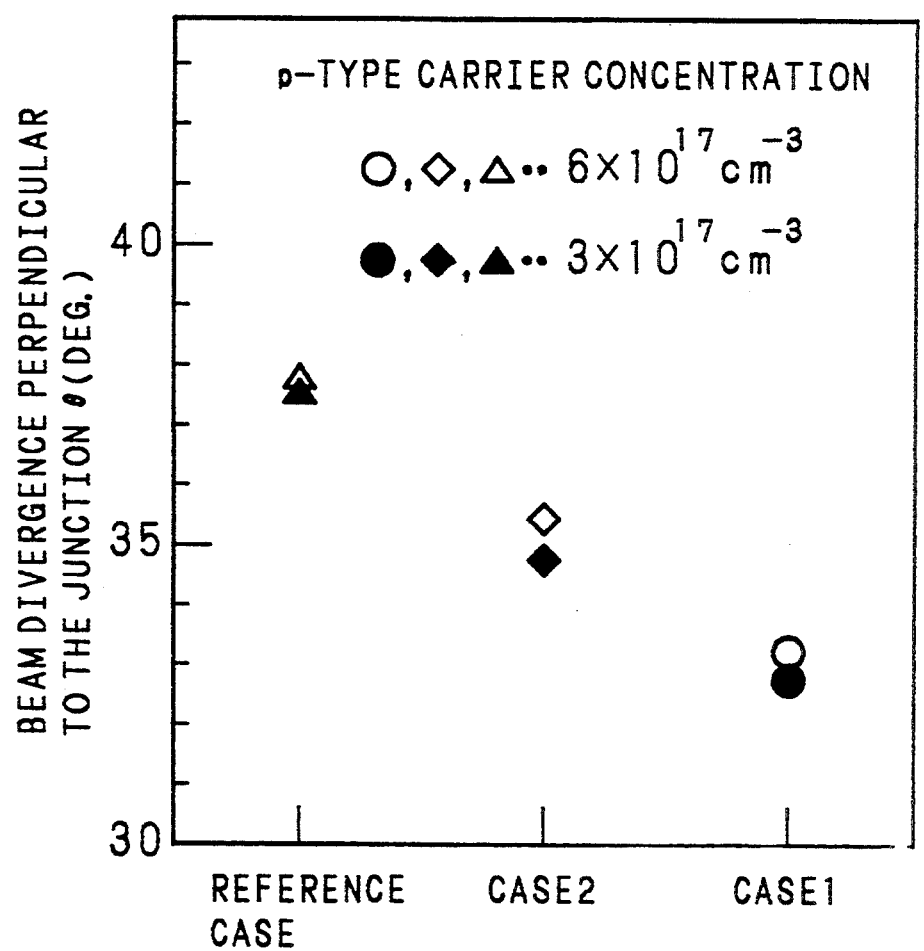
FIG. 12 is a graph showing the characteristic of beam divergence of the second embodiment and an example for comparison.

FIG. 12 shows the relationship between the beam divergence perpendicular to the junction $\theta$ (degree) of a semiconductor laser as cases 1 and 2 and a reference case and the p-type carrier concentration. It is seen from FIG. 12 that regardless of the carrier concentration of the second barrier layer 27 and the cladding layer 28a the beam divergence $\theta$ of cases 1 and 2 and the reference case is about 33, about 35 and about 37 degrees, respectively. More specifically, the beam divergence $\theta$ is smaller for the case 2 having the second barrier layer 27 than for the reference case lacking both the first and second barrier layers 25, 27, and is even smaller for the case 1 having both the first and second barrier layers 25, 27.

Figure 13:
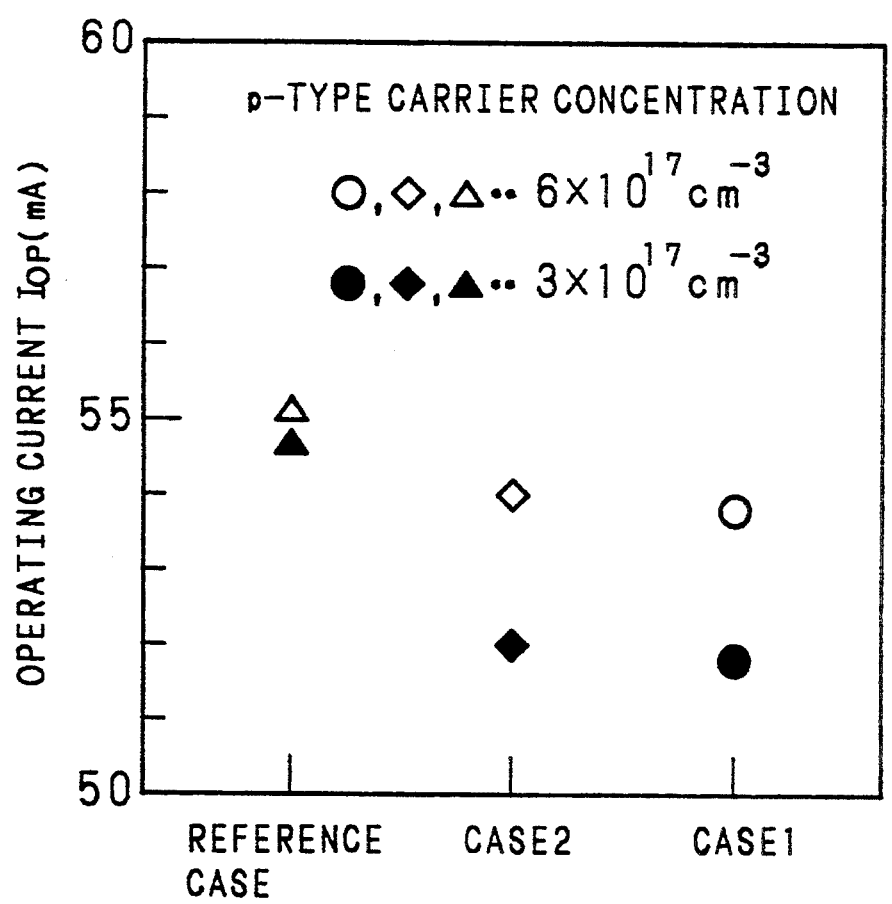
FIG. 13 is a graph showing the characteristic of the operating current of the second embodiment and an example for comparison.

FIG. 13 is a diagram showing the relationship between the operating current $I_{op}$ (mA) of a semiconductor laser as cases 1 and 2 and a reference case and the p-type carrier concentration. As will be seen from FIG. 13, the operating current $I_{op}$ is smaller for case 2 having the second barrier layer 27 than for the reference case lacking both the first and second barrier layers 25, 27, and is even smaller for the case 1 having both the first and second barrier layers 25, 27. Especially, it is noted that the operating current is smaller when the carrier concentration of the second barrier layer 27 and the cladding layer 28a is reduced.

Figure 14:
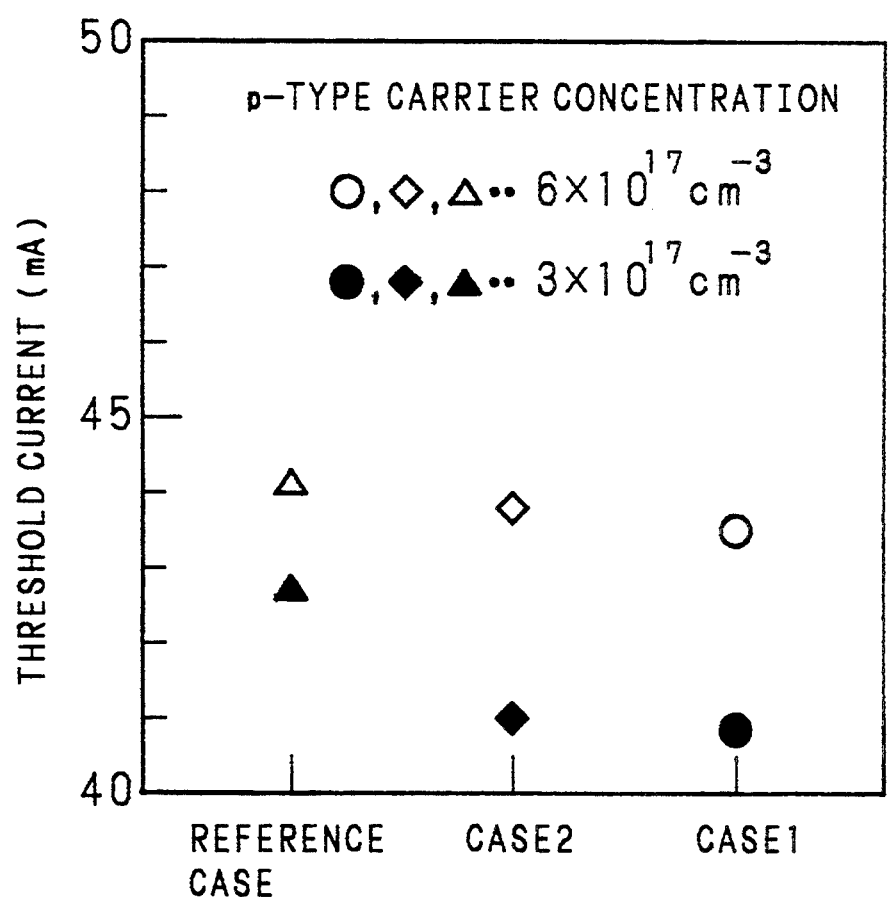
FIG. 14 is a graph showing the characteristic of a pulsation threshold current of the second embodiment and an example for comparison.

The relationship between the threshold current $I_{th}$ (mA) of a semiconductor laser as cases 1 and 2 and a reference case and the p-type carrier concentration is shown in FIG. 14. It is noted from FIG. 14 that the threshold current $I_{th}$, like the operating current $I_{op}$, is smaller for the case 2 having the second barrier layer 27 than for the reference case lacking both the first and second barrier layers 25, 27, and is even smaller for the case 1 having both the first and second barrier layers 25, 27. Further, the threshold current can be reduced to a smaller level when the carrier concentration of the second barrier layer 27 and the cladding layer 28a is reduced.

Figure 15:
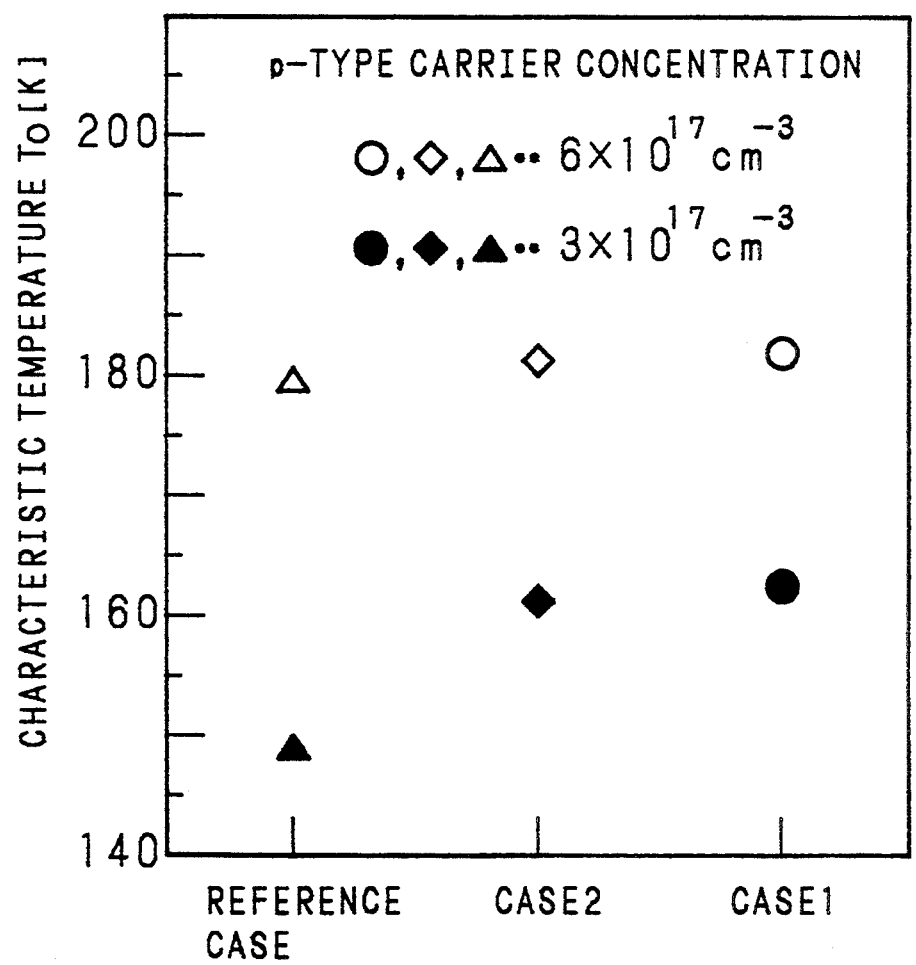
FIG. 15 is a graph showing the characteristic of characteristic temperature of the second embodiment and an example for comparison.

FIG. 15 is a diagram showing the relationship between the characteristic temperature $T_o$ (K) of a semiconductor laser as cases 1 and 2 and a reference case and the p-type carrier concentration. It is seen from FIG. 15 that the characteristic temperature $T_o$ is higher for the case 2 having the second barrier layer 27 than for the reference case lacking both the first and second barrier layers 25, 27, and is even higher for the case 1 having both the first and second barrier layers 25, 27. Especially, it is noted that the characteristic temperature can be increased considerably when the carrier concentration of the second barrier layer 27 and the cladding layer 28a is large.

FIGS. 12 to 15 indicate that the beam divergence perpendicular to the junction $\theta$ and the operating current $I_{op}$ are better for the case 2 having the second barrier layer 27 than for the reference case lacking both the first and second barrier layers 25, 27, and also that it is much better for the case 1 having both the first and second barrier layers 25, 27. As will be seen from the cases 1 and 2, the threshold current $I_{th}$ and the characteristic temperature $T_o$ assume a value which poses no problem at all as long as the p-type carrier concentration of the second barrier layer 27 and the cladding layer 28a is in the normal range. As described above, with the increase in the p-type carrier concentration, the characteristic temperature $T_o$ remains satisfactory while the operating current $I_{op}$ and the threshold current $I_{th}$ are deteriorated. As the p-type carrier concentration decreases, on the other hand, the characteristic temperature $T_o$ is deteriorated while both the operating temperature $I_{op}$ and the threshold current $I_{th}$ are improved. These trends should be selectively used in the particular application. Further, though not shown, the astigmatic distance remains substantially the same for the reference case and the case 2, and is smaller for the case 1. The carrier concentration of other than the second barrier layer 27 and the cladding layer 28a, which has no substantial effect on the laser characteristics, may be selected appropriately within normal range.

The operating current and the beam divergence perpendicular to the junction $\theta$ can be reduced even when the thickness of the first and second barrier layers 25, 27 is smaller than that of the active layer 26. However, this effect is more conspicuous especially, in the case where the thickness of the first and second barrier layers 25, 27 is larger than that of the active layer 26 than in the case where the thickness of the first and second barrier layers 25, 27 is reduced considerably (i.e., with the light beam not substantially affected by the first and second barrier layers 25, 27). Such a conspicuous effect is obtained in the case where the first and second saturable optical absorbing layers 24, 29 are configured in such a position as to sandwich the active layer 26 on the one hand and the first barrier layer 25 or the second barrier layer 27 having a larger thickness than the active layer 26 is formed in proximity to the active layer 26 on the other hand. An especially desirable effect is obtained in the case where the first and second saturable optical absorbing layers 24, 29 and the first and second barrier layers 25, 27 are positioned symmetrically with respect to the active layer 26.

A method of fabricating a semiconductor laser according to the second embodiment will be explained below with reference to FIG. 16.

Figure 16A:
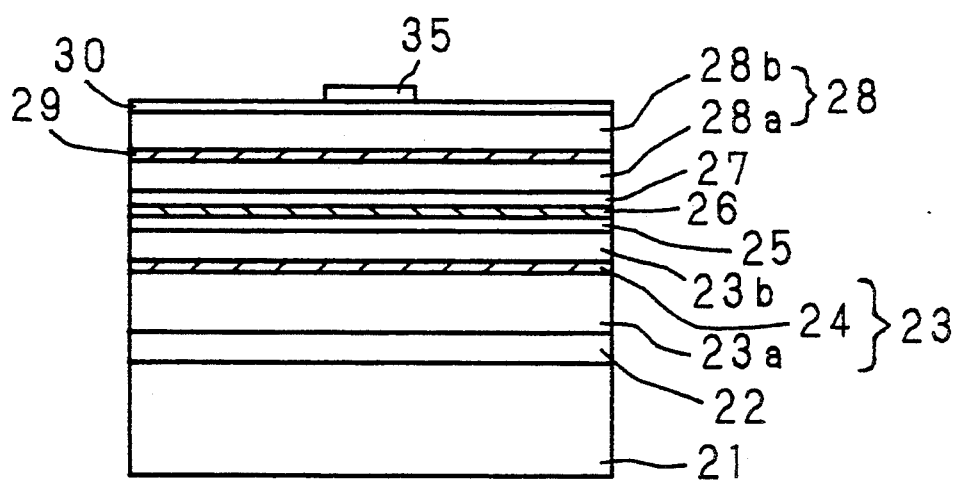
FIGS. 16(a) and 16(b) are sectional views showing the fabrication process for a semiconductor laser according to the second embodiment.

First, as shown in FIG. 16(a), an n-type buffer layer 22, an n-type cladding layer 23a, an n-type first saturable optical absorbing layer 24, an n-type cladding layer 23b, an n-type first barrier layer 25, an undoped active layer 26, a p-type second barrier layer 27, a p-type cladding layer 28a, a p-type second saturable optical absorbing layer 29, a p-type cladding layer 28b and a p-type cap layer 30 are formed successively in that order on an n-type semiconductor substrate 21 by the MOCVD or MBE method. After that, a striped $SiO_2$ mask layer 35 having a thickness of 0.2 μm is formed on the p-type cap layer 30 by the use of ordinary photolithography or the like. The p-type cap layer 30 and the p-type cladding layer 28b are etched off in such a manner as to leave the p-type cladding layer 28b in the thickness of 0.1 to 0.3 μm by the etching solution consisting of the $H_3PO_4$—$H_2O_2$—$H_2O$ system with the $SiO_2$ mask layer 35. Then the remaining cladding layer 28b is etched off by the hydrochloric acid etchant to form a striped ridge section. In the process, the second saturable optical absorbing layer 29 functions as what is called an etching stop layer so that the mesa etching may be stopped with high controllability at the second saturable optical absorbing layer 29 as in the first embodiment described above.

Figure 16B:
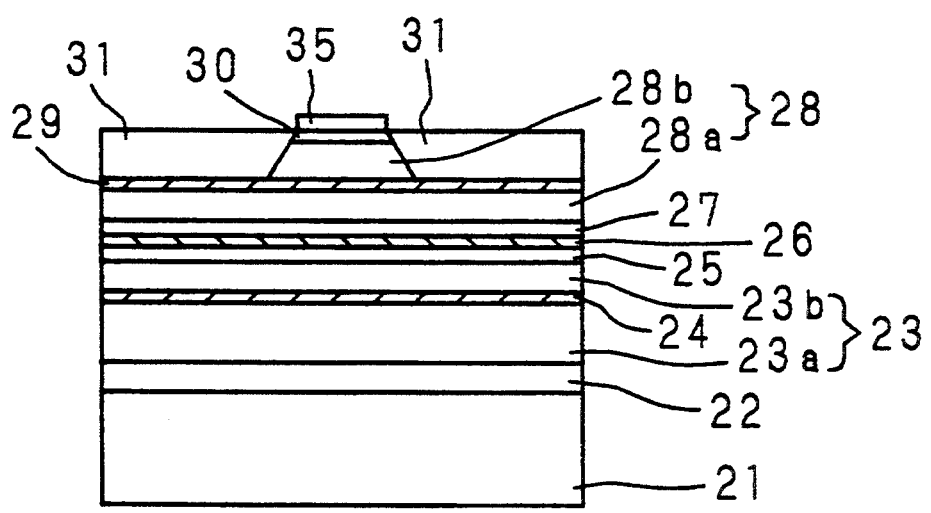

After that, as shown in FIG. 16(b), the n-type current-blocking layers 31, 31 are formed on the side of the p-type cladding layer 28b and the p-type cap layer 30 shaped as a ridge as well as on the second saturable optical absorbing layer 29 by the MOCVD or MBE method with the $SiO_2$ mask layer 35. In the next step, the $SiO_2$ mask layer 35 is removed by the HF etchant to expose the p-type cap layer 30, after which a p-type contact layer 32 is formed on the exposed p-type cap layer 30 and the n-type current-blocking layers 31, 31 by the MOCVD or MBE method. Then a p-type ohmic electrode 33 of Au-Cr and an n-type ohmic electrode 34 of Au-Sn-Cr are formed on the upper surface of the p-type contact layer 32 and on the lower side of the n-type GaAs substrate 21, thereby fabricating a semiconductor laser as shown in FIG. 10.

In the semiconductor laser according to the second embodiment, besides the configuration of the first embodiment, the barrier layers 25, 27 having a refractive index smaller than and a band gap larger than the first and second cladding layers 23, 26 are formed between the first cladding layer 23 and the active layer 26 and/or between the active layer 26 and the second cladding layer 28, thereby reducing the optical feedback induced noise sufficiently. Further, this configuration reduces the operating current for a reduced power consumption on the one hand and reduces the beam divergence perpendicular to the junction for an improved coupling coefficient with an objective lens which may be used in combination with the particular laser on the other hand. Consequently, power consumption is reduced even more. Further, the smaller astigmatic distance sufficiently converges the laser beam output, thereby improving the S/N for crosstalks when the laser is used as a light source of an optical disk system or the like.

According to the second embodiment, the barrier layer of thickness larger than active layer is further formed in the configuration in which the saturable optical absorbing layers are formed in both cladding layers, so, even in the configuration affected by the difference in refractive index between the active layer and the barrier layer, the beam divergence perpendicular to the junction can be reduced. Thus, when the barrier layer is thick, the variation in the beam divergence perpendicular to the junction can be reduced and the variation in the thickness of the barrier layer has little effect on the laser characteristics, thereby improving the production yield.

Although the $Al_qGa_{1-q}As$ ($0 \leq q < 0.2$) layer is used as the active layers 4, 26 according to the first and second embodiments, a quantum well structure as described in the third embodiment later is of course usable as an alternative with equal effect.

Further, instead of the AlGaAs semiconductor laser described above according to the first and second embodiments, a similar effect is attained with an AlGaInP semiconductor laser, for example. The AlGaInP semiconductor, which decreases in refractive index and increases in band gap with the increase in the Al composition ratio like the AlGaAs semiconductor, enables the band gap and the refractive index to be selected by changing the Al composition ratio.

Third embodiment

With reference to the first and second embodiments, in the case where the saturable optical absorbing layer is of a bulk structure (with the layer thickness more than several hundred Å where the quantum effect is not caused), the band gap energy of the saturable optical absorbing layer can be made substantially equal to the energy corresponding to lasing wavelength by changing the composition ratio of the saturable optical absorbing layer and by thus regulating the magnitude of the band gap. When the composition ratio of the saturable optical absorbing layer is changed in this manner, however, a crystalline defect occurs in the crystal of the saturable optical absorbing layer of the AlGaInP or GaInAsP semiconductor laser, with the result that a high threshold current deteriorates the characteristics of the semiconductor laser. Especially when the lasing wavelength is short (as when the active layer consists of MQW structure), it is difficult to make a band gap energy substantially equal to the energy corresponding to lasing wavelength. In other words, the band gap energy of the saturable optical absorbing layer is difficult to control merely with the composition ratio.

Also, the semiconductor laser with a self-sustained pulsation having an active layer of MQW structure has the problem that the astigmatic distance is increased or the kink (nonlinearity of the output power-current characteristic) is caused at low output power.

When the saturable optical absorbing layer is of a quantum well structure with a quantum well layer having a layer thickness of 200 Å less, control of the thickness of the well layer (hereinafter referred to as "the well width") in the above-mentioned range makes it possible to match the band gap energy easily between the saturable optical absorbing layer and the active layer without posing any problem of crystalline defect or the like. When the well width is reduced, for example, the band gap energy is increased. An increased well width, on the other hand, decreases the band gap energy. The number of well layers, which is determined by the material used and the well width, may be single or plural.

The strained quantum well structure of the saturable optical absorbing layer facilitates the matching of the band gap energy between the saturable optical absorbing layer and the active layer with high accuracy by a method of introducing a lattice strain by changing the composition ratio of the compound semiconductor used for the well layers and by the above method of controlling the well width. Also, as in the case where the saturable optical absorbing layer is constructed of a quantum well structure, the number of well layers is determined by the material used and the well width and may be single or plural.

Figure 17:
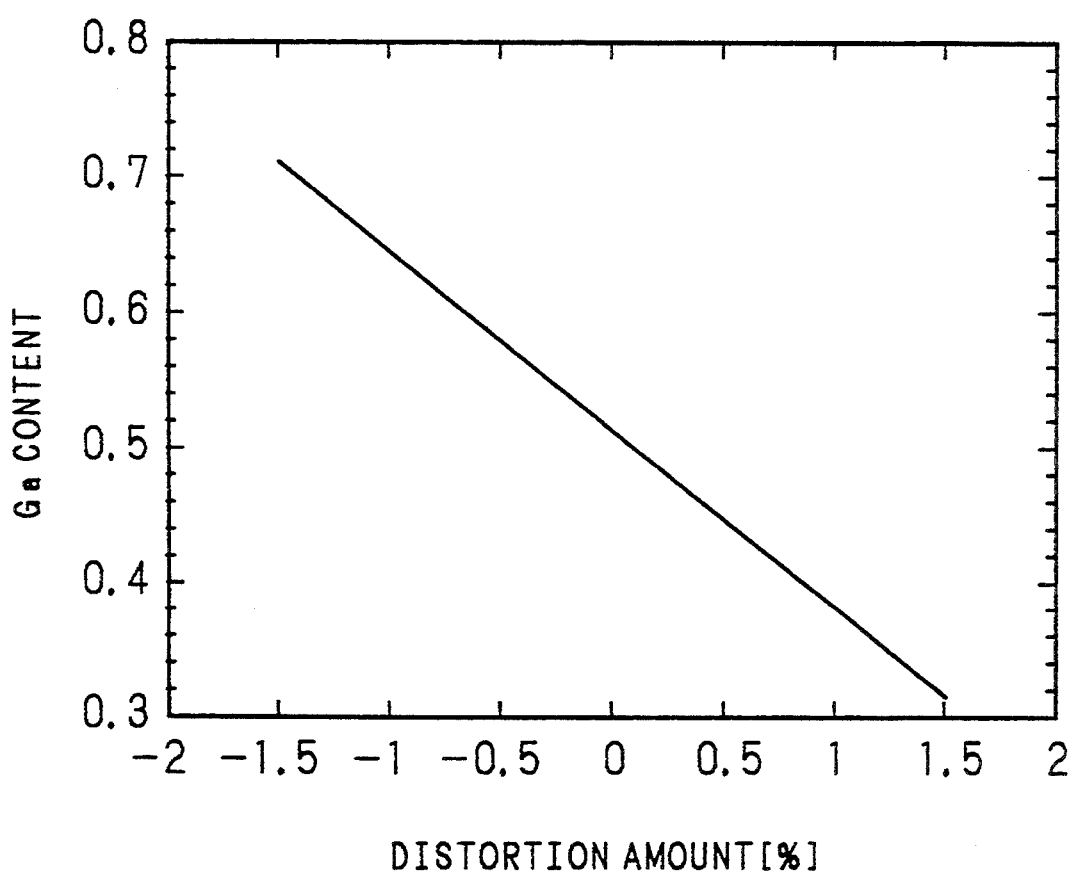
FIG. 17 is a graph showing the relation between the strain and the Ga composition ratio of GaInP.

FIG. 17 is a graph showing the relation between the Ga content x and the strain in the $Ga_xIn_{1-x}P$ formed on a GaAs semiconductor substrate. In the case where the strain assumes a positive value, a compression strain is indicated, while a negative value represents a tensile, strain. In this case, if the compression strain is increased, i.e., the Ga content is reduced, the lasing wavelength becomes longer. An increased tensile strain, i.e., an increased Ga content, on the other hand, shortens the lasing wavelength. As shown in FIG. 17, the Ga content and the strain have a linear relation with each other. By changing the Ga content, therefore, the desired strain is easily obtained, thereby making it possible to control the band gap energy of the saturable optical absorbing layer. Also, as long as the well width is kept below a critical layer thickness (the layer thickness where a crystalline defect begins to occur) of the desired strain, the problem of crystalline defect is not posed.

Once the active layer is constructed of a quantum well structure or a strained quantum well structure, the frequency of the self-sustained pulsation can be controlled to produce a low-noise semiconductor laser in addition to the effect of producing a quantum well structure or a strained quantum well structure of a saturable optical absorbing layer. Although the operating current can be reduced by decreasing the number of well layers, the gain is reduced. Therefore, the number of well layers is determined in combination with the well width.

Now, a third embodiment of the invention configured as described above will be explained.

Figure 18:
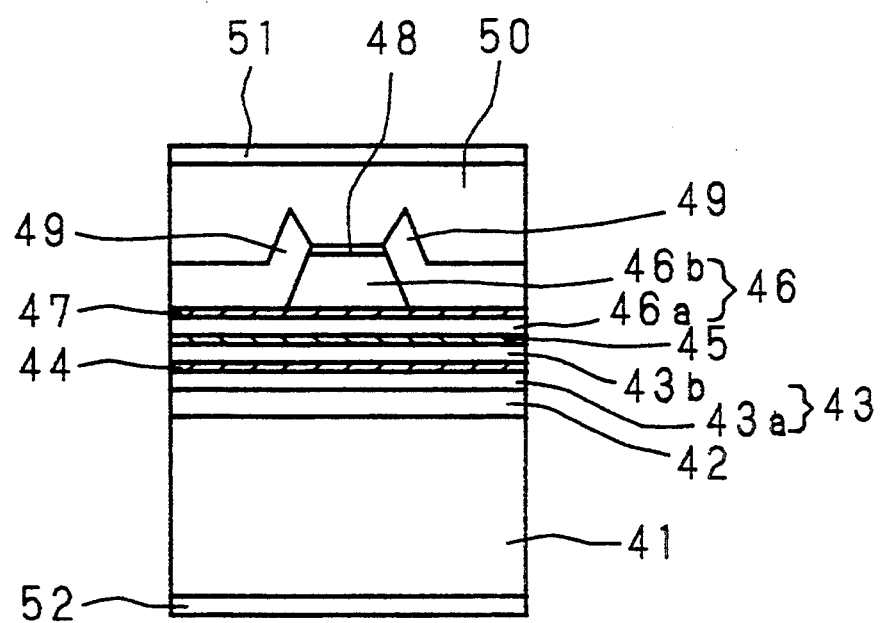
FIG. 18 is a sectional view showing a semiconductor laser according to a third embodiment of the invention.

FIG. 18 is a schematic diagram showing a sectional structure of an AlGaInP semiconductor laser according to a third embodiment of the invention, as related to a red semiconductor laser. In FIG. 18, numeral 41 designates an n-type GaAs semiconductor substrate, on which are formed an n-type GaInP buffer layer (typically having a thickness of 0.3 $\mu$m) 42, an n-type $(Al_{0.7}Ga_{0.3})_{0.5}In_{0.5}P$ cladding layer 43a, an n-type strained quantum well first saturable optical absorbing layer 44 and an n-type $(Al_{0.7}Ga_{0.3})_{0.5}In_{0.5}P$ cladding layer 43b, in that order. The cladding layers 43a, 43b make up a first cladding layer (typically having a thickness of 0.8 $\mu$m) 48, which includes the first saturable optical absorbing layer 44 therein.

The first cladding layer 43 (cladding layer 43b) has formed thereon an undoped strained MQW active layer 45. The active layer 45, in turn, has formed thereon a p-type $(Al_{0.7}Ga_{0.3})_{0.5}In_{0.5}P$ cladding layer 46a, a p-type strained quantum well second saturable optical absorbing layer 47 and a p-type $(Al_{0.7}Ga_{0.3})_{0.5}In_{0.5}P$ cladding layer 46b constituting a striped ridge section extending in the cavity direction, in that order. The two cladding layers 46a, 46b make up a p-type second cladding layer (typically having a thickness of 1.1 $\mu$m and a stripe width of 5 $\mu$m) 46 having a striped ridge section. The second cladding layer 46 has formed therein the second saturable optical absorbing layer 47.

The cladding layer 46b has the upper surface of the ridge section thereof formed with a p-type GaInP cap layer 48. Two n-type GaAs current-blocking layers (typically having a thickness of 1 $\mu$m) 49, 49 are formed on the side of the cap layer 48, on the side of the cladding layer 46b, and on the upper surface of the second saturable optical absorbing layer 47 lacking the cladding layer 46b. The cap layer 48 and the current-blocking layers 49, 49 have formed thereon a p-type GaAs contact layer 50. The contact layer 50 has formed thereon a p-type ohmic electrode 51 of Au-Cr, and the semiconductor substrate 41 has formed on the lower side thereof an n-type ohmic electrode 52 of Au-Sn-Cr.

Figure 19:
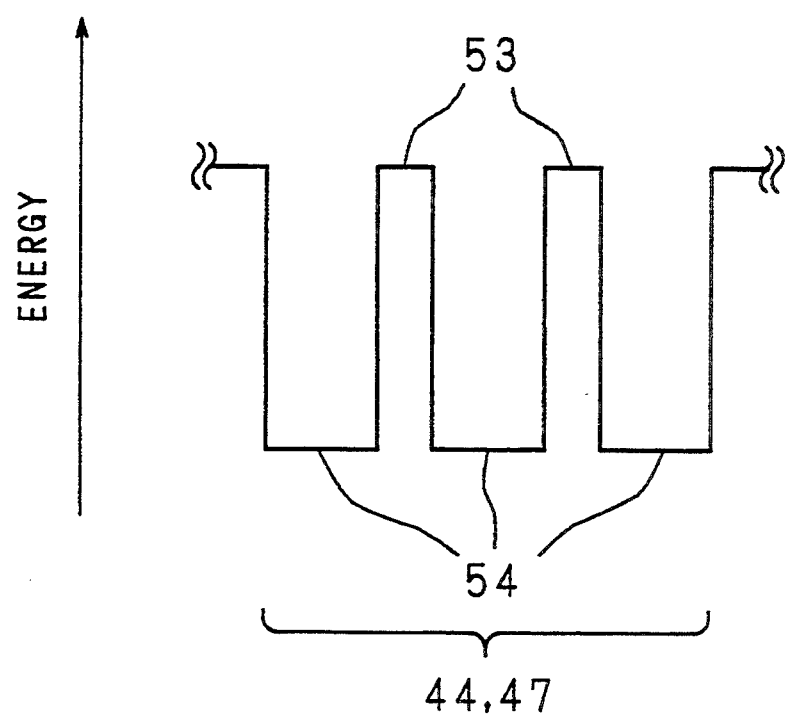
FIG. 19 is an energy band diagram for a saturable optical absorbing layer consisting of strained quantum well layers according to the third embodiment.

The energy band of the first and second saturable optical absorbing layers 44, 47 is shown in FIG. 19. Each of the saturable optical absorbing layers 44, 47, as shown in FIG. 19, includes a barrier layer (typically having a thickness of 50 Å) 53 of $(Al_{0.7}Ga_{0.3})_{0.5}In_{0.5}P$ and a well layer (typically having a thickness of 100 Å strain of +0.5 to +1.0%) 54 of $Ga_xIn_{1-x}P$ alternately with each other, thereby forming three well layers 54 according to this embodiment.

Figure 20:
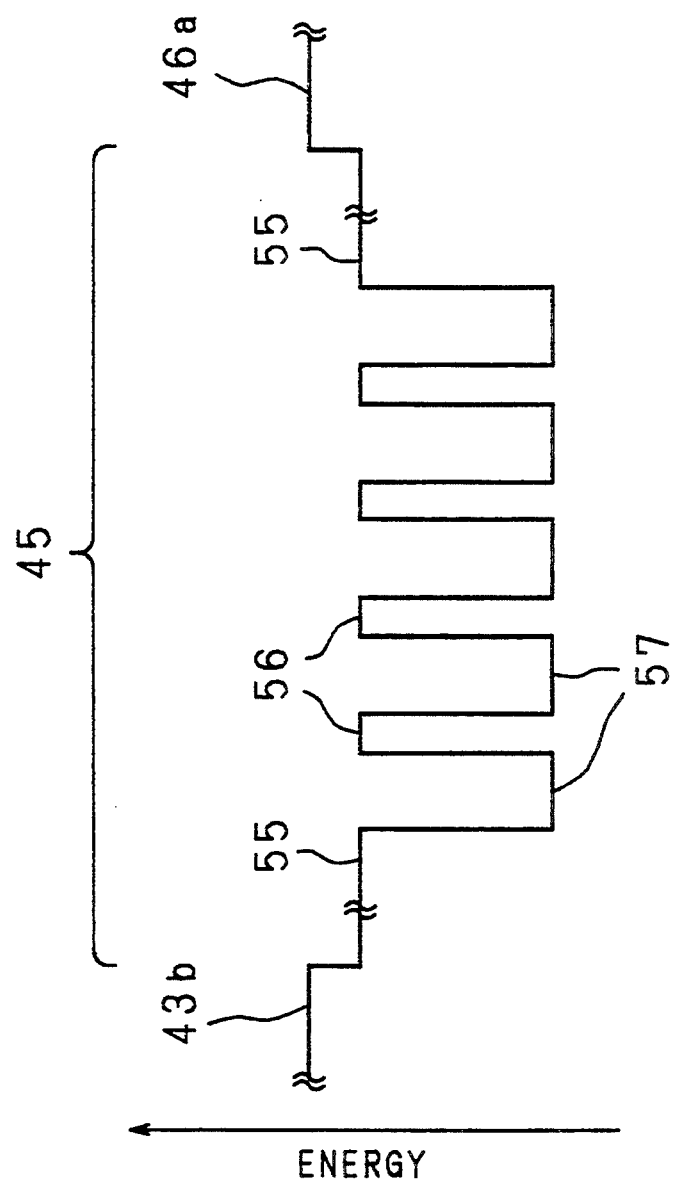
FIG. 20 is an energy band diagram for a strained MQW (Multi Quantum Well) active layer according to the third embodiment.

The energy band of the strained MQW active layer 45 is shown in FIG. 20. The active layer 45, as shown in FIG. 20, includes a guide layer (typically having a thickness of 500 Å) 55 of $(Al_{0.5}Ga_{0.5})_{0.5}In_{0.5}P$, which in turn has formed thereon a barrier layer (typically having a thickness of 50 Å) 56 of $(Al_{0.5}Ga_{0.5})_{0.5}In_{0.5}P$ and a well layer (typically having a thickness of 100 Å and a strain of −0.5%) 57 of GaInP in alternate layers. Further, a guide layer (typically having a thickness of 500 Å) 55 of $(Al_{0.5}Ga_{0.5})_{0.5}In_{0.5}P$ is formed on the resulting assembly. According to this embodiment, five to eight well layers 57 produce a superior characteristic. In FIG. 20, as an example, five well layers 57 are formed. The guide layers 55 are formed for the purpose of improving the luminous efficiency by trapping and guiding the light.

FIG. 21 is a graph showing the output power-current characteristic of a prior-art semiconductor laser with a self-sustained pulsation and a semiconductor laser according to the present embodiment with the thickness of the active layers and the cladding layers appropriately selected, FIG. 21(a) shows the case of a prior-art semiconductor laser, and FIG. 21(b) the case of a semiconductor laser according to the embodiment. The semiconductor laser used according to the embodiment includes a strained MQW active layer 45 with five well layers 57 having a strain of +0.5%, strained quantum well saturable optical absorbing layers 44, 47 with a well layer 54 having a strain of +0.6%, and a cladding layer 46a having a thickness of 0.25 $\mu$m under the current-blocking layer 49. The prior-art semiconductor laser thus used includes a strained MQW active layer composed of seven well layers (100 Å) having a strain of 0.5% and six barrier layers (50 Å), with the cladding layer as thick as 0.35 $\mu$m under the current-blocking layer. It is seen from FIGS. 21(a) and 21(b) that according to the embodiment under consideration, the nonlinearity of the output power-current characteristic is improved considerably. The threshold current, astigmatic distance and the presence or absence of kink in these semiconductor lasers are also shown in Table 1. As obvious from Table 1, the astigmatic distance is shortened according to the embodiment.

TABLE 1

|  | Threshold current (mA) | Astigmatic distance (μm) | Presence or absence of kink |
|---|---|---|---|
| Prior art | 50~55 | 15~20 | With kink at 3 to 4 mW |
| Embodiment | 52~56 | 10~15 | No kink up to 5 mW |

Figure 22:
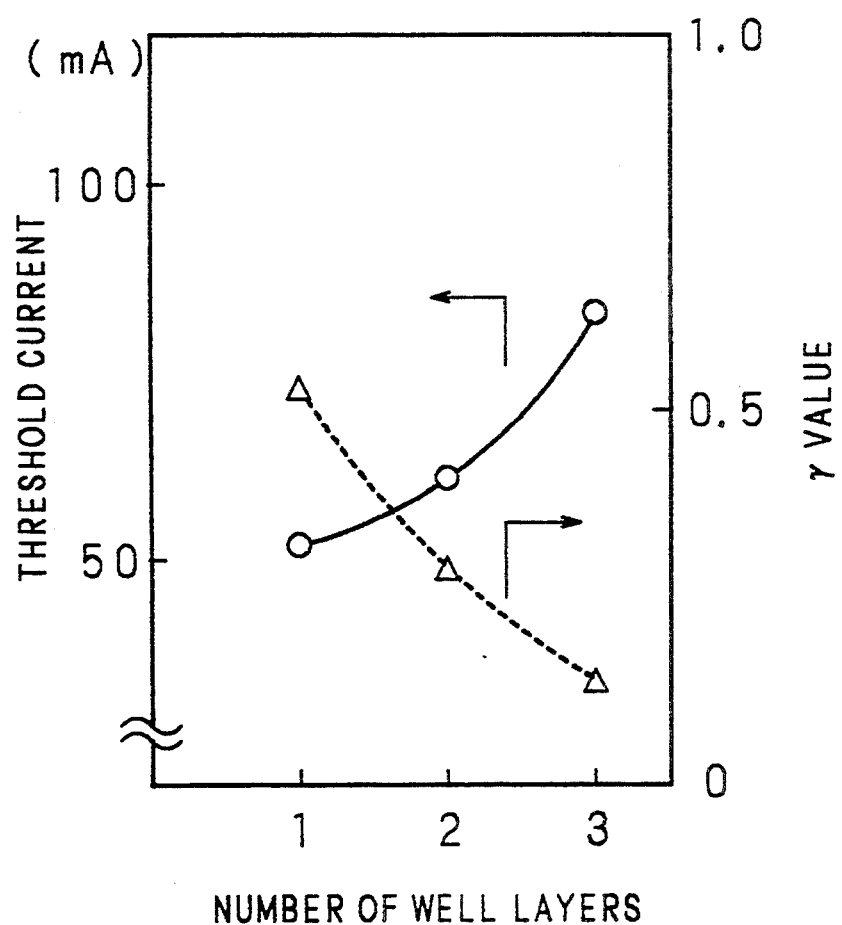
FIG. 22 is a graph showing a threshold current and $\gamma$ value against the number of well layers of the saturable optical absorbing layer consisting of strained quantum well layers according to the third embodiment.

FIG. 22 is a graph showing the $\gamma$ value representing the light interference and the threshold current against the number of the well layers 54 of the strained quantum well saturable optical absorbing layers 44, 47 according to the embodiment. When the $\gamma$ value is 1.0, the operation is in single mode. The smaller the $\gamma$ value, the stronger the self-sustained pulsation. For the $\gamma$ value less than 0.7, a satisfactory self-sustained pulsation is obtained. The semiconductor laser used in this experiment includes a well layer 54 having a thickness of 100 Å and a strain of $+0.6\%$, a well layer 57 having a thickness of 100 Å, a barrier layer 56 having a thickness of 50 Å and a strain of $+0.5\%$, and a cladding layer 46a under the current-blocking layer 49 having a thickness of 0.25 μm. In the case where the number of the well layers 54 is increased in order to reduce the light interference, the threshold current is increased. As a result, according to the embodiment, it is desirable to form one to three well layers 54 in the strained quantum well saturable optical absorbing layers 44, 47.

A method of fabricating a semiconductor laser according to the third embodiment will be described below with reference to FIG. 23.

Figure 23A:
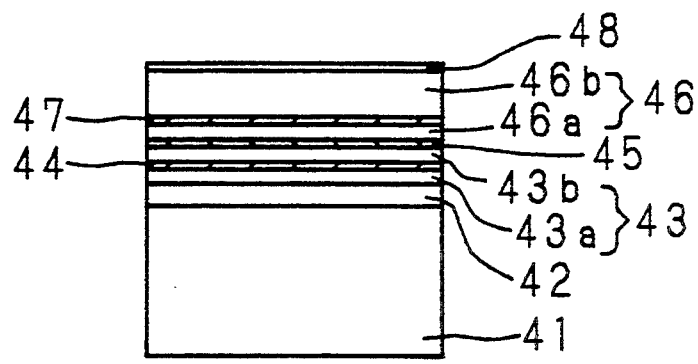
FIGS. 23(a), 23(b), 23(c), 23(d), 23(e) and 23(f) are sectional views showing the fabrication process for a semiconductor laser according to the third embodiment.
Figure 23B:
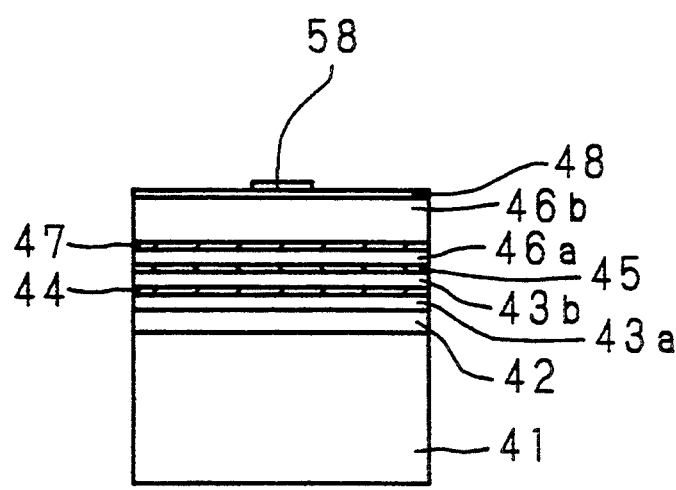
Figure 23C:
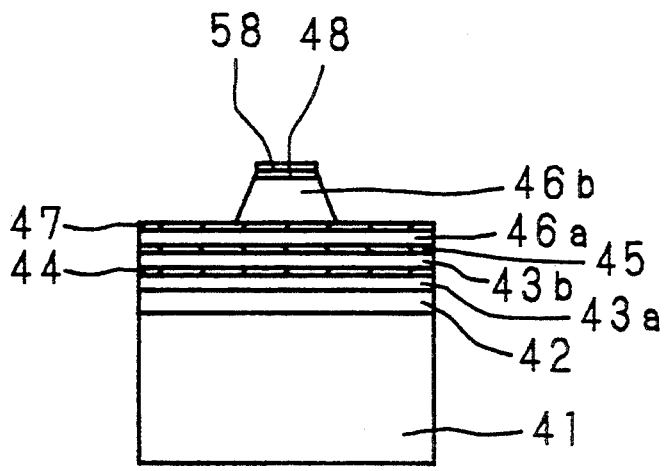

First, an n-type buffer layer 42, an n-type cladding layer 43a, an n-type strained quantum well saturable optical absorbing layer 44, an n-type cladding layer 43b, an undoped strained MQW active layers 45, a p-type cladding layer 46a, a p-type strained quantum well saturable optical absorbing layer 47, a p-type cladding layer 46b and a p-type cap layer 48 are formed sequentially on an n-type semiconductor substrate 41 by the MOCVD method (FIG. 23(a)). Then, an SiO₂ film is formed by the electron beam vapor deposition or the CVD method, and a mask 58 is produced by patterning into a stripe about 5 μm wide by photolithography (FIG. 23(b)). That portion of the cap layer 48 and the cladding layer 48b which is not covered by the mask 58 is removed into a ridge shape by etching (30° C., 30 seconds) using hydrobromic acid through the mask 58 (FIG. 23(c)).

Figure 23D:
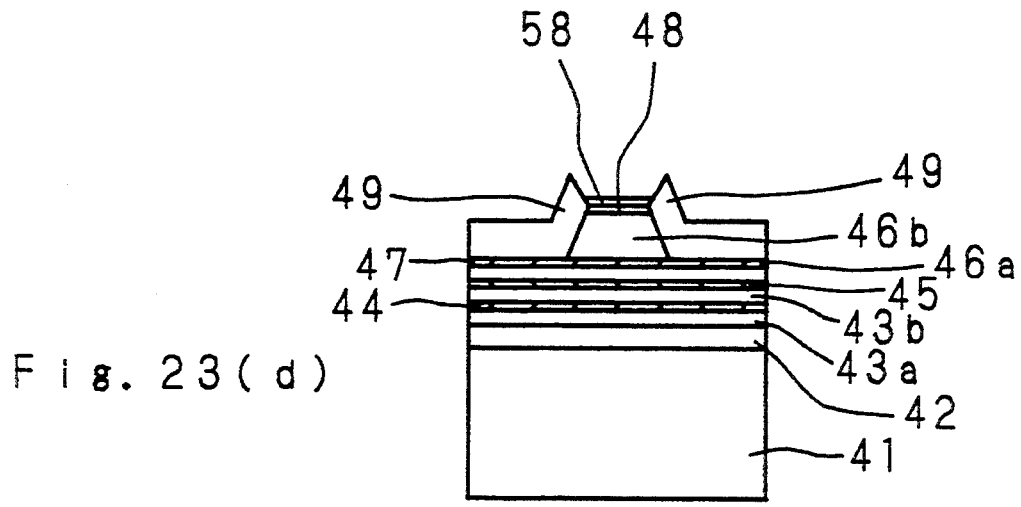
Figure 23E:
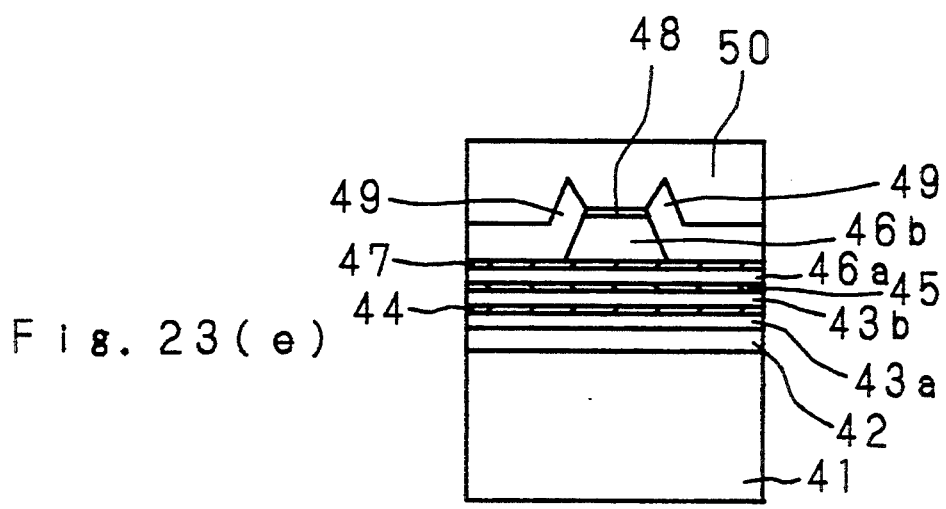
Figure 23F:
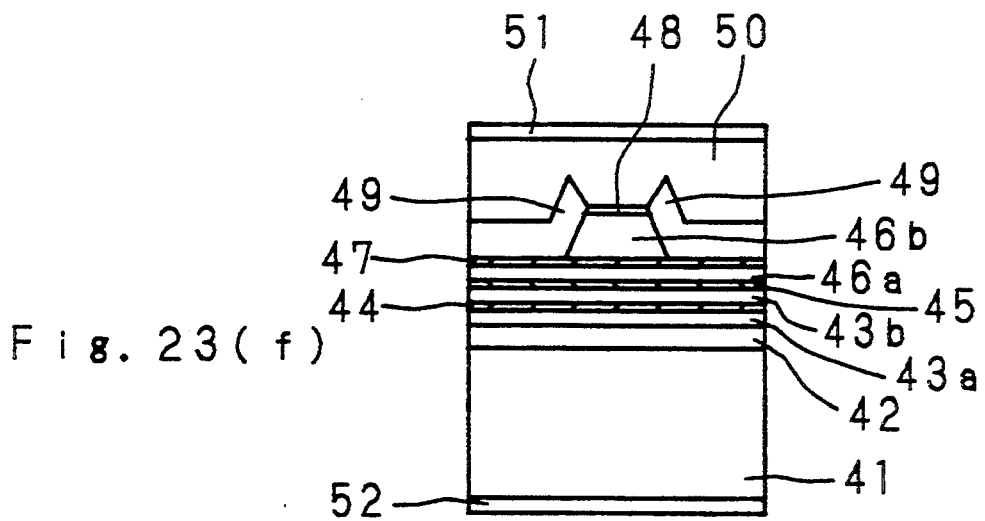

After that, an n-type GaAs is grown selectively thereby to form current-blocking layers 49, 49 (FIG. 23(d)). After removing the mask 58 by a buffer hydrofluoric acid solution, a contact layer 50 of p-type GaAs is formed by the MOCVD method (FIG.23 (e)). A p-type ohmic electrode 51 is formed on the upper surface of the contact layer 50 and an n-type ohmic electrode 52 on the lower surface of the substrate 41, thereby fabricating a semiconductor laser (FIG. 23(f)).

Although the third embodiment uses a strained quantum well saturable optical absorbing layer having a strained quantum well structure, a quantum well saturable optical absorbing layer having a quantum well structure may be used as an alternative with equal effect. The energy corresponding to lasing wavelength is desirably substantially equal to the quantization level of the conduction band and the valence band in the well layer of the quantum well structure constituting the saturable optical absorbing layer. The third embodiment is applicable to a semiconductor laser having an active layer of MQW, SQW (Single Quantum Well) or bulk structure as well as the strained MQW structure.

The third embodiment has been explained above with reference to a red semiconductor laser using GaInP and AlGaInP. The embodiment, however, is of course applicable to all semiconductor lasers with a self-sustained pulsation using semiconductors of other compound semiconductors.

It will thus be understood from the foregoing description that in the semiconductor laser according to the third embodiment, the band gap energy can be easily matched between the saturable optical absorbing layer and the active layer by constructing the former as a quantum well structure. Further, with a strained quantum well structure of the saturable optical absorbing layer, the band gap energy can be controlled easily and accurately, thereby realizing a semiconductor laser having a superior low-noise high-output characteristic.

Since the Al composition ratio of the cladding layer 46b is different from that of the quantum well layer 57 of the saturable optical absorbing layer 47 having a quantum well structure or a strained quantum well structure, the saturable optical absorbing layer 47 can function as an etching stop layer by using a selective etchant wherein the etching rate for compound semiconductor with lower Al composition ratio is smaller than that for compound semiconductor with higher Al composition ratio.

That is, as well as the above first, second and third embodiments, in a semiconductor laser with a self-sustained pulsation which consists of compound semiconductor containing Al such as AlGaAs, AlGaInP or the like and has a saturable optical absorbing layer with a band gap energy substantially equal to the energy corresponding to lasing wavelength, the saturable optical absorbing layer includes at least a portion with Al composition layer lower than the cladding layer. Consequently, by using a selective etchant wherein the etching rate for compound semiconductor with lower Al composition ratio is smaller than that for compound semiconductor with higher Al composition ratio, this saturable optical absorbing can function as an etching stop layer.

In each of the above-mentioned embodiments, the place where a saturable optical absorbing layer is formed is determined by the required amount of light absorption and is not limited to the interior of the two cladding layers. A saturable optical absorbing layer may be formed, for example, on the upper surface of the first cladding layer and the lower surface of the second cladding layer.

Although each cladding layer constituting the first and second cladding layers is configured to have the same refractive index and band gap in each of the embodiments described above, they are not necessarily identical to each other. In other words, the first and second cladding layers are not required to be uniform.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A semiconductor laser with a self-sustained pulsation, comprising in this order:
   a semiconductor substrate of a first conductive type;
   a first cladding layer of the first conductive type;
   a saturable optical absorbing layer of the first conductive type;
   a second cladding layer of the first conductive type;
   an active layer;
   a third cladding layer of a second conductive type opposite to the first conductive type;
   a saturable optical absorbing layer of the second conductive type;
   a fourth cladding layer of the second conductive type having a striped ridge shape extending in the cavity direction; and
   a current-blocking layer of the first conductive type formed on the upper surface of said saturable optical absorbing layer of the second conductive type where said fourth cladding layer is not formed and on both sides of said fourth cladding layer; wherein
   each of said first to fourth cladding layers has a refractive index smaller than and a band gap larger than said active layer and said saturable optical absorbing layers, each of said saturable optical absorbing layers has a band gap of energy substantially equal to the energy corresponding to lasing wavelength, and said saturable optical absorbing layer of the second conductive type is capable of being functional as an etching stop layer.

2. A semiconductor laser with a self-sustained pulsation according to claim 1, wherein said first and second cladding layers are an $Al_{xa}Ga_{1-xa}As$ cladding layer and an $Al_{xb}Ga_{1-xb}As$ cladding layer, respectively, said saturable optical absorbing layer of the first conductive type is an $Al_{ua}Ga_{1-ua}As$ ($0 \leq ua < 0.2 < xa, xb$) layer, said third and fourth cladding layers are an $Al_{ya}Ga_{1-ya}As$ cladding layer, and an $Al_{yb}Ga_{1-yb}As$ cladding layer, respectively, and said saturable optical absorbing layer of the second conductive type is an $Al_{ub}Ga_{1-ub}As$ ($0 \leq ub < 0.2 < ya, yb$) layer.

3. A semiconductor laser with a self-sustained pulsation according to claim 2, wherein said active layer is an $Al_q Ga_{1-q}As$ ($0 \leq q < 0.2$) layer, and the following condition is satisfied:

$$q - 0.01 \leq ua, ub \leq q + 0.01 \quad q < xa, xb, ya, yb.$$

4. A semiconductor laser with a self-sustained pulsation, comprising in this order:
   a semiconductor substrate of a first conductive type;
   a first cladding layer of the first conductive type; an active layer; and
   a second cladding layer of a second conductive type opposite to the first conductive type; wherein
   said first and second cladding layers have a refractive index smaller than and a band gap larger than said active layer, and a saturable optical absorbing layer having a structure selected from a group consisting of a quantum well structure and a strained quantum well structure which have band gaps of energy substantially equal to the energy corresponding to lasing wavelength is formed in said first cladding layer and/or said second cladding layer, said saturable optical absorbing layer having band gaps smaller than and a refractive index larger than said first and second cladding layers.

5. A semiconductor laser with a self-sustained pulsation according to claim 4, wherein said second cladding layer has a flat section and a striped ridge section, and said saturable optical absorbing layer is disposed between the flat section and the striped ridge section.

6. A semiconductor laser with a self-sustained pulsation according to claim 1, wherein said active layer has a structure selected from a group consisting of a quantum well structure and a strained quantum well structure.

7. A semiconductor laser with a self-sustained pulsation according to claim 4, wherein said active layer has a structure selected from a group consisting of a quantum well structure and a strained quantum well structure.

8. A semiconductor laser with a self-sustained pulsation according to claim 1, further comprising:
   a barrier layer, which is formed between said second cladding layer and said active layer and/or between said active layer and said third cladding layer, and which has a refractive index smaller than and a band gap larger than said second and third cladding layers.

9. A semiconductor laser with a self-sustained pulsation according to claim 4, wherein
   a barrier layer having a refractive index smaller than and a band gap larger than said first and second cladding layers is formed between said first cladding layer and said active layer and/or between said active layer and said second cladding layer.

10. A semiconductor laser with a self-sustained pulsation according to claim 8, wherein the thickness of said barrier layer is larger than that of said active layer.

* * * * *